United States Patent
Lichtenwalner

(10) Patent No.: US 11,276,762 B2
(45) Date of Patent: Mar. 15, 2022

(54) INTERFACE LAYER CONTROL METHODS FOR SEMICONDUCTOR POWER DEVICES AND SEMICONDUCTOR DEVICES FORMED THEREOF

(71) Applicant: Wolfspeed, Inc., Durham, NC (US)

(72) Inventor: Daniel Jenner Lichtenwalner, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 16/855,161

(22) Filed: Apr. 22, 2020

(65) Prior Publication Data

US 2021/0336022 A1 Oct. 28, 2021

(51) Int. Cl.
| | |
|---|---|
| *H01L 29/423* | (2006.01) |
| *H01L 29/78* | (2006.01) |
| *H01L 29/36* | (2006.01) |
| *H01L 29/66* | (2006.01) |

(52) U.S. Cl.
CPC ........ *H01L 29/42368* (2013.01); *H01L 29/36* (2013.01); *H01L 29/66681* (2013.01); *H01L 29/7816* (2013.01)

(58) Field of Classification Search
None
See application file for complete search history.

(56) References Cited

U.S. PATENT DOCUMENTS

2009/0184366 A1* 7/2009 Ozawa ............. H01L 29/66825
257/326

* cited by examiner

*Primary Examiner* — Hsien Ming Lee
(74) *Attorney, Agent, or Firm* — Myers Bigel, P.A.

(57) ABSTRACT

A semiconductor device includes a semiconductor layer structure, a gate insulating pattern on the semiconductor layer structure, a gate electrode on the gate insulating pattern, and an interface layer between the gate insulating pattern and the semiconductor layer structure, the interface layer having a first segment and a second segment with a gap therebetween.

33 Claims, 24 Drawing Sheets

INTERFACE LAYER CONTROL METHODS FOR SEMICONDUCTOR POWER DEVICES AND SEMICONDUCTOR DEVICES FORMED THEREOF

FIELD

The present invention relates to semiconductor devices and, more particularly, to power semiconductor switching devices.

BACKGROUND

The Metal Oxide Semiconductor Field Effect Transistor ("MOSFET") is a well known type of semiconductor transistor that may be used as a switching device. A MOSFET is a three terminal device that includes a source region and a drain region that are separated by a channel region, and a gate electrode that is disposed adjacent the channel region. A MOSFET may be turned on or off by applying a gate bias voltage to the gate electrode. When a MOSFET is turned on (i.e., it is in its "on-state"), current is conducted through the channel region of the MOSFET between the source region and the drain region. When the bias voltage is removed from the gate electrode (or reduced below a threshold level), the current ceases to conduct through the channel region. By way of example, an n-type MOSFET has n-type source and drain regions and a p-type channel. An n-type MOSFET thus has an "n-p-n" design. An n-type MOSFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

The gate electrode of a power MOSFET is typically separated from the channel region by a thin gate insulating pattern, such as a silicon oxide pattern. Because the gate electrode of the MOSFET is insulated from the channel region by the gate insulating pattern, minimal gate current is required to maintain the MOSFET in its on-state or to switch the MOSFET between its on-state and its off-state. The gate current is kept small during switching because the gate forms a capacitor with the channel region. Thus, only minimal charging and discharging current is required during switching, allowing for less complex gate drive circuitry.

The bipolar junction transistor ("BJT") is another well known type of semiconductor transistor that is also routinely used as a switching device. A BJT includes two p-n junctions that are formed in close proximity to each other in the semiconductor material. In operation, charge carriers enter a first region of the semiconductor material (the emitter) that is adjacent one of the p-n junctions. Most of the charge carriers exit the device from a second region of the semiconductor material (the collector) that is adjacent the other p-n junction. The collector and emitter are formed in regions of the semiconductor material that have the same conductivity type. A third, relatively thin region of the semiconductor material, known as the base, is positioned between the collector and the emitter and has a conductivity type that is opposite the conductivity type of the collector and the emitter. Thus, the two p-n junctions of the BJT are formed where the collector meets the base and where the base meets the emitter. By flowing a small current through the base of a BJT, a proportionally larger current passes from the emitter to the collector.

BJTs are current controlled devices in that a BJT is turned "on" (i.e., it is biased so that current flows between the emitter and the collector) by flowing a current through the base of the transistor. For example, in an n-p-n BJT (i.e., a BJT that has n-type collector and emitter regions and a p-type base region), the transistor is typically turned on by applying a positive voltage to the base to forward bias the base-emitter p-n junction. When the device is biased in this manner, the hole current that flows into the base of the transistor is injected into the emitter. The holes are referred to as "majority carriers" because the base is a p-type region, and holes are the "normal" charge carriers in such a region. In response to the hole current into the emitter, electrons are injected from the emitter into the base, where they diffuse toward the collector. These electrons are referred to as "minority carriers" because electrons are not the normal charge carrier in the p-type base region. The device is referred to as a "bipolar" device because the emitter-collector current includes both electron and hole current.

A BJT may require a relatively large base current to maintain the device in its on-state. As such, relatively complex external drive circuits may be required to supply the relatively large base currents that can be required by high power BJTs. Moreover, the switching speeds of BJTs may be significantly slower than the switching speeds of power MOSFETs due to the bipolar nature of the current conduction.

A third well known type semiconductor switching device is the Insulated Gate Bipolar Transistor ("IGBT"), which is a device that combines the high impedance gate of the power MOSFET with the small on-state conduction losses of the power BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit.

There is an increasing demand for high power semiconductor switching devices that can pass large currents in their "on" state and block large voltages (e.g., hundreds or even thousands of volts) in their reverse blocking state. In order to support high current densities and block such high voltages, power MOSFETs and IGBTs typically have a vertical structure with the source and drain on opposite sides of a thick semiconductor layer structure in order to block higher voltage levels. In very high power applications, the semiconductor switching devices are typically formed in wide band-gap semiconductor material systems (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high electron mobility, high melting point and high-saturated electron drift velocity. Relative to devices formed using other semiconductor materials such as, for example, silicon, electronic devices formed using silicon carbide may have the capability of operating at higher temperatures, at high power densities, at higher speeds, at higher power levels and/or under high radiation densities.

SUMMARY

Pursuant to some embodiments of the present invention, a semiconductor device includes a semiconductor layer structure, a gate insulating pattern on the semiconductor layer structure, a gate electrode on the gate insulating pattern, and an interface layer between the gate insulating pattern and the semiconductor layer structure, the interface layer having a first segment and a second segment with a gap therebetween.

In some embodiments, the first segment of the interface layer extends from an edge of the gate insulating pattern in a direction towards a center portion of the gate insulating pattern.

In some embodiments, a dopant concentration of a portion of the first segment of the interface layer decreases as the first segment extends towards the center portion of the gate insulating pattern.

In some embodiments, a thickness of the gate insulating pattern is greater near the edge of the gate insulating pattern than in the center portion of the gate insulating pattern.

In some embodiments, the first segment and the second segment of the interface layer are substantially coplanar.

In some embodiments, the semiconductor layer structure comprises a first source/drain region, a second source/drain region, and a junction field effect transistor (JFET) region between the first source/drain region and the second source/drain region.

In some embodiments, wherein the gap is over at least a portion of the JFET region.

In some embodiments, the interface layer comprises hydrogen (H), nitrogen (N), boron (B), phosphorous (P), lanthanum (La), strontium (Sr), and/or barium (Ba).

In some embodiments, the interface layer further comprises a third segment that is farther from a top surface of the semiconductor layer structure than the first segment or the second segment.

In some embodiments, the semiconductor device further includes a dielectric pattern between the top surface of the semiconductor layer structure and the third segment of the interface layer.

In some embodiments, a portion of the gate electrode extends below a top surface of the semiconductor layer structure.

Pursuant to some embodiments of the present invention, a semiconductor device includes a semiconductor layer structure comprising a first source/drain region, a second source/drain region, and a junction field effect transistor (JFET) region between the first source/drain region and the second source/drain region, a gate insulating pattern on the semiconductor layer structure, a gate electrode on the gate insulating pattern, and an interface layer comprising a first segment and a second segment, where the first segment is between the first source/drain region and the gate insulating pattern, the second segment is between the second source/drain region and the gate insulating pattern, and an upper surface of the semiconductor layer structure between at least a portion of the JFET region and the gate insulating pattern is free of the interface layer.

In some embodiments, the first segment of the interface layer extends towards the JFET region from a first position over the first source/drain region to a second position beyond the first source/drain region that is between the gate insulating pattern and the upper surface of the semiconductor layer structure.

In some embodiments, a dopant concentration of the first segment of the interface layer decreases as the first segment extends towards the second position.

In some embodiments, the interface layer comprises hydrogen (H), nitrogen (N), boron (B), phosphorous (P), lanthanum (La), strontium (Sr), and/or barium (Ba).

In some embodiments, the interface layer further comprises a third segment on the JFET region that is farther from a top surface of the semiconductor layer structure than the first segment or the second segment.

In some embodiments, the semiconductor device further includes a dielectric pattern between the JFET region and the third segment of the interface layer.

In some embodiments, a bottom surface of the gate electrode extends below a bottom surface of the first source/drain region.

Pursuant to some embodiments of the present invention, a semiconductor device includes a semiconductor layer structure, a gate insulating pattern on the semiconductor layer structure, a gate electrode on the gate insulating pattern, and an interface layer between the gate insulating pattern and the semiconductor layer structure, the interface layer having first and second edge portions on opposite sides of a center portion, where a dopant concentration of the interface layer decreases from the first edge portion to the center portion.

In some embodiments, a first segment of the interface layer extends from the first edge portion of the interface layer in a direction towards the center portion of the interface layer.

In some embodiments, a change in the dopant concentration of the interface layer decreases from the first edge portion to the center portion is linear, exponential, step, and/or random.

In some embodiments, the interface layer comprises a first segment in the first edge portion of the interface layer and a second segment in the second edge portion of the interface layer, the semiconductor layer structure includes a first source/drain region, a second source/drain region, and a junction field effect transistor (JFET) region between the first source/drain region and the second source/drain region, and the semiconductor device further includes a gap between the first segment and the second segment of the interface layer that is over at least a portion of the JFET region.

In some embodiments, the interface layer comprises hydrogen (H), nitrogen (N), boron (B), phosphorous (P), lanthanum (La), strontium (Sr), and/or barium (Ba).

In some embodiments, a portion of the gate electrode extends below a top surface of the semiconductor layer structure.

In some embodiments, the interface layer is also present between the gate electrode and the gate insulating pattern.

Pursuant to some embodiments of the present invention, a method of forming a semiconductor device includes forming a semiconductor layer structure, forming a gate insulating pattern on the semiconductor layer structure; forming an interface material on the gate insulating pattern; and performing an anneal operation on the interface material so as to form an interface layer of the interface material between the gate insulating pattern and the semiconductor layer structure.

In some embodiments, the method further includes forming a gate electrode on the gate insulating pattern, where forming the interface material on the gate insulating pattern comprises forming the interface material on the gate insulating pattern and the gate electrode.

In some embodiments, the method further includes a protective dielectric barrier on the gate insulating pattern, where forming the interface material on the gate insulating pattern comprises forming the interface material on the gate insulating pattern and the protective dielectric barrier.

In some embodiments, a first interface between the protective dielectric barrier and the semiconductor layer structure is substantially coplanar with a second interface between the gate insulating pattern and the semiconductor layer structure.

In some embodiments, wherein the semiconductor layer structure comprises a first source/drain region, a second source/drain region, and a junction field effect transistor (JFET) region between the first source/drain region and the second source/drain region, the interface layer comprises a first segment and a second segment, the first segment is between the first source/drain region and the gate insulating pattern, the second segment is between the second source/drain region and the gate insulating pattern, and an upper surface of the semiconductor layer structure between at least a portion of the JFET region and the gate insulating pattern is free of the interface layer.

In some embodiments, performing the anneal operation diffuses the interface material along an interface between the gate insulating pattern and the semiconductor layer structure.

In some embodiments, the method further includes forming a trench in the semiconductor layer structure, wherein forming the gate insulating pattern on the semiconductor layer structure comprises forming the gate insulating pattern in the trench on the semiconductor layer structure.

In some embodiments, the interface layer has a first and second edge portions on opposite sides of a center portion, and a dopant concentration of the interface layer decreases from the first edge portion to the center portion.

Pursuant to some embodiments of the present invention, a method of forming a semiconductor device includes forming a semiconductor layer structure, forming a blocking pattern on the semiconductor layer structure, forming an interface material on the semiconductor layer structure and the blocking pattern, forming a gate insulating pattern on the semiconductor layer structure and the interface material, and forming an interface layer of the interface material between the gate insulating pattern and the semiconductor layer structure, the interface layer comprising a first segment and second segment with a gap therebetween.

In some embodiments, the method further includes removing the blocking pattern before forming the gate insulating pattern.

In some embodiments, removing the blocking pattern removes a portion of the interface material between the first segment and the second segment.

In some embodiments, the gate insulating pattern is formed on the blocking pattern.

In some embodiments, the interface layer further comprises a third segment between the first segment and the second segment.

In some embodiments, the semiconductor layer structure comprises a first source/drain region, a second source/drain region, and a junction field effect transistor (JFET) region between the first source/drain region and the second source/drain region, the first segment is between the first source/drain region and the gate insulating pattern, the second segment is between the second source/drain region and the gate insulating pattern, and an upper surface of the semiconductor layer structure between at least a portion of the JFET region and the gate insulating pattern is free of the interface layer.

In some embodiments, the method further includes forming a trench in the semiconductor layer structure, wherein forming the gate insulating pattern on the semiconductor layer structure comprises forming the gate insulating pattern in the trench.

In some embodiments, the blocking pattern comprises a dielectric material.

DETAILED DESCRIPTION

Figure 1:
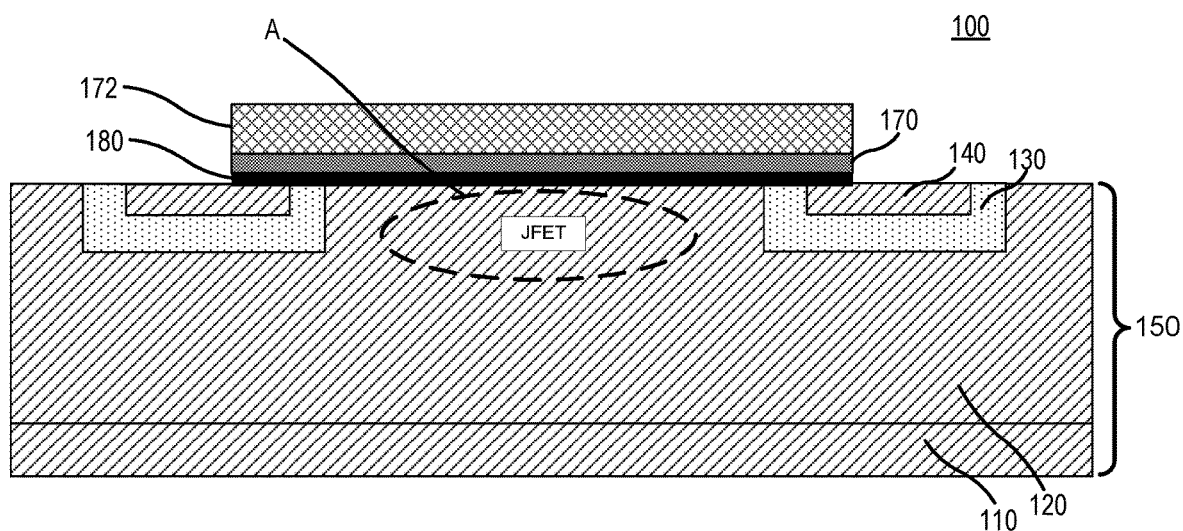
FIG. 1 is a schematic cross-sectional diagram of a unit cell of a conventional semiconductor device, with areas of concern identified according to some embodiments described herein.

Power silicon carbide MOSFETs are in use today for applications requiring high voltage blocking such as voltage blocking of 5,000 volts or more. By way of example, silicon carbide MOSFETs are commercially available that are rated for current densities of 10 A/cm$^2$ or more that will block voltages of at least 10 kV. To form such devices, a plurality of "unit cells" are typically formed, where each unit cell includes a MOSFET transistor. In high power applications, a large number of these unit cells (e.g., hundreds or thousands) are typically provided on a single semiconductor substrate, and a gate electrode pattern is formed on a top side of the semiconductor substrate that acts as the gate electrode for all of the unit cells. The opposite (bottom) side of the semiconductor substrate acts as a common drain for all of the units cells of the device. A plurality of source contacts are formed on source regions in the semiconductor layer structure that are exposed within openings in the gate electrode pattern. These source contacts are also electrically connected to each other to serve as a common source. The resulting device has three terminals, namely a common source terminal, a common drain terminal and a common gate electrode that act as the terminals for the hundreds or thousands of individual unit cell transistors. It will be appreciated that the above description is of an n-type MOSFET; the locations of the drain and source would be reversed for a p-type MOSFET.

For traditional MOSFET structures, such as power MOSFETs using SiC, one potential issue is the presence of a high electrical field at the gate oxide in the center of the junction field effect (JFET) region of the device. A JFET region generally is an active portion of an N-type drift layer which may include an N-type dopant and is located between two P-type wells. The JFET region refers to a region in the drift layer that is in contact with channel regions coming up to the surfaces of the P-type wells responsive to the application of a gate voltage. The JFET region makes up a conduction path for electrons that includes the N+ source region, the channel region, the N-type drift layer, the substrate, and the drain electrode. Under operation conditions at which a high bias is applied to the drain (close to the operational maximum) and in which the gate is held near ground potential, a high electrical field is created in the gate oxide that sits just above the JFET region. Imperfections in the interface material and gate oxide could result in a gate oxide failure during long-term blocking operation, in which the drain is placed under a high positive bias. In addition, traditional MOSFETs also may suffer from possible hot carrier injection during long-term blocking operation, in which the drain is placed under a high positive bias.

The present disclosure describes an approach to improve interface protection in metal-oxide (or insulator)-semiconductor (MOS or MIS) devices. This may be particularly useful for improving the gate regions in a power transistor (e.g., a MOSFET, MISFET, or an IGBT).

FIG. 1 is a schematic cross-sectional diagram of a unit cell of a conventional semiconductor device 100, with areas of concern identified according to some embodiments described herein.

As shown in FIG. 1, the device 100 may be or include a transistor (e.g., a MOSFET) formed using an n-type silicon carbide semiconductor substrate 110. The substrate 110 may comprise, for example, a single crystal 4H silicon carbide semiconductor substrate that is heavily-doped with n-type impurities (i.e., an n+ silicon carbide substrate). A lightly-doped n-type (n−) silicon carbide drift layer 120 is provided on the substrate 110. Upper portions of the n-type silicon carbide drift layer 120 may be doped p-type by ion implantation to form p-wells 130. Each p-well 130 may be formed by ion implantation, though the embodiments described herein are not limited thereto.

As is known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer. The ions will implant at different depths into the semiconductor layer so that the predetermined kinetic energy will provide an implant "profile" with varying ion concentrations as a function of depth.

Heavily-doped (n+) n-type silicon carbide source regions 140 may be formed in upper portions of the p-wells 130. The n-type source regions 140 may be formed by ion implantation. The heavily-doped (n+) n-type silicon carbide regions 140 act as source regions for the device 100. The drift layer 120 and the substrate 110 together act as a common drain region for the device 100. The n-type silicon carbide substrate 110, the n-type silicon carbide drift layer 120, the p-wells 130, and the n-type source regions 140 formed therein may together comprise a semiconductor layer structure 150 of the device 100.

A gate insulating pattern 170 may be formed on the upper surface of the semiconductor layer structure 150. The gate insulating pattern 170 may comprise, for example, a silicon dioxide (SiO$_2$) layer, although other insulating materials, a silicon dioxide (SiO$_2$) layer, although other insulating materials, such as SiO$_x$N$_y$, Si$_x$N$_y$, Al$_2$O$_3$ and/or high-K dielectrics such as hafnium oxide, and the like may be used. A gate electrode 172 may be formed on the gate insulating pattern 170 opposite the semiconductor layer structure 150.

Although not illustrated in FIG. 1 source contacts may be formed on the heavily-doped n-type source regions 140, and a drain contact may be formed on the lower surface of the substrate 110. It will be appreciated that the above description is of an n-type MOSFET. In p-type devices, the locations of the source and drain contacts may be reversed, and the conductivity types of the other n- and p-type regions may be swapped. Accordingly, the source region 140 can be referred to as a "source/drain region" 140.

An interface layer 180 including interface elements may be disposed between the gate insulating pattern 170 and the semiconductor layer structure 150. In some embodiments, the interface layer 180 may include hydrogen (H), nitrogen (N), boron (B), phosphorous (P), lanthanum (La), strontium (Sr), and/or barium (Ba). The interface layer 180 may improve the interface quality of MOS or other gate-controlled semiconductor devices (for example, a SiC semiconductor). For example, the interface layer 180 may reduce an on-state resistance of the device 100 when the device 100 is conducting.

In a conventional device, a gate region of a vertical MOSFET or IGBT device may have two channel regions, and a middle region (JFET region) where current flows to the bottom of the device. The interface layer 180 may include a passivation layer that may be used to eliminate electronically active interface states so as to obtain good device properties. For silicon (Si) devices, an anneal in H$_2$ may be used to provide an H interface control (or passivation) layer as part of the interface layer 180. With GaAs-based devices, a sulfur (S) layer can be used. With SiC-based devices, an anneal in N$_2$O or NO provides an N passivation layer as part of the interface layer 180. However, with SiC-based devices, an improved passivation approach is needed to achieve the full benefit from the SiC semiconductor properties. For example, the elements of the interface layer 180 may, in some circumstances, degrade the gate insulating pattern 170 (e.g., the gate dielectric), resulting in earlier gate breakdown. Thus a better approach for applying an interface layer 180 is needed, as is described herein.

Typical methods of controlling a MOS interface utilize annealing the gate oxide or gate dielectric (also referred to herein as a "gate insulating pattern") in a gas, or by deposition of a control layer on the semiconductor, and growing an insulator layer as the gate oxide/dielectric over the control layer. Both of these methods cause the interface controlling element (such as H, B, N, P, Sr, La, or Ba) to cover the entire interface, and possibly diffuse throughout the entire gate dielectric (e.g., SiO$_2$, SiO$_x$N$_y$, Al$_2$O$_3$, or other similar gate dielectrics). This can be detrimental to the gate dielectric properties, and degrades the MOS reliability and stability under gate voltage stress. The middle of the gate region of a vertical MOSFET or a vertical IGBT is subject to the highest electric field in the blocking or off-state. Thus, interface layers 180, including, for example, interface passivation elements, in a MOS stack over the JFET region can result in a decreased gate dielectric breakdown strength in reverse-bias conditions, adversely impacting the device reliability.

Embodiments described herein provide improvements to methods of providing an interface layer, and improved devices utilizing such layers, such that the interface control element (e.g., the interface layer) does not reach, or is reduced at, the center of the gate region where the electric field is highest. As discussed herein, the JFET region of the device may be subjected to the highest electrical field during a blocking operation of the semiconductor device. This area is identified in FIG. 1, for example, using the dotted circle labeled 'A.'

Figure 2A:
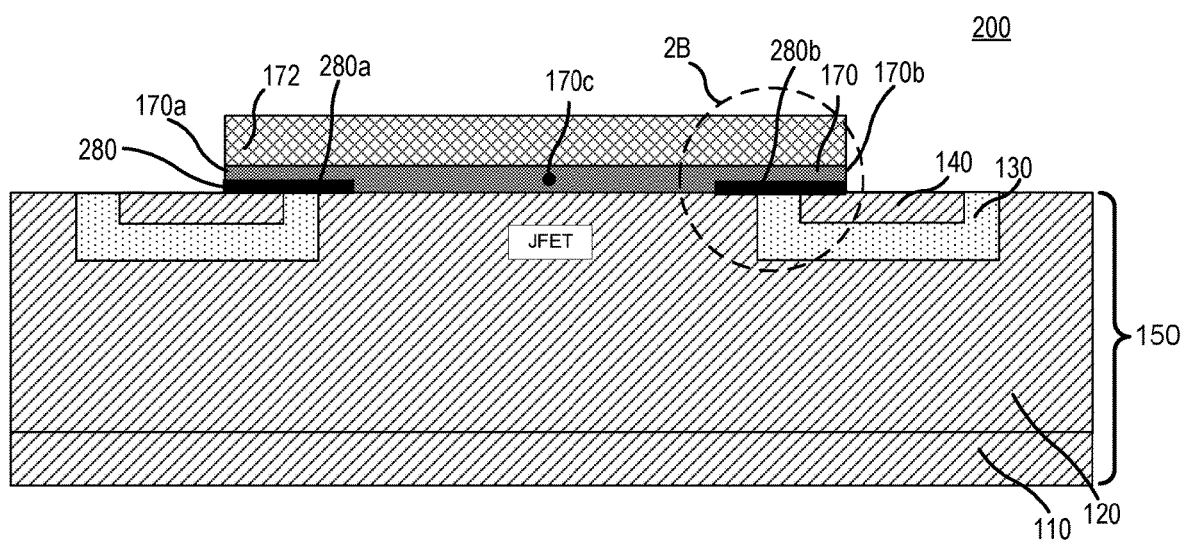
FIG. 2A is a schematic cross-sectional diagram of a semiconductor device, according to some embodiments described herein.

FIG. 2A is a schematic cross-sectional diagram of a semiconductor device 200, according to some embodiments described herein. A description of those elements of FIG. 2A that are the same or similar to those of FIG. 1 will be omitted for brevity. Accordingly, the description of FIG. 2A will focus on differences with the device previously described.

As illustrated in FIG. 2A, the semiconductor device 200 according to some embodiments described herein may include a substrate 110 and drift layer 120, with p-wells 130 and source/drain regions 140 formed in the drift layer 120.

The substrate 110, drift layer 120, p-wells 130, and the source/drain regions 140 formed therein may together comprise a semiconductor layer structure 150 of the device 200. As with FIG. 1, source and drain contacts are not illustrated in FIG. 2A for ease of description.

A gate insulating pattern 170 may be formed on the upper surface of the semiconductor layer structure 150. The gate insulating pattern 170 can be any stable dielectric with a bandgap approximately 2 eV larger than the semiconductor underneath. The gate insulating pattern 170 can be a multilayer material stack or a single dielectric compound or alloy. The gate insulating pattern 170 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used.

A gate electrode 172 may be formed on the gate insulating pattern 170 opposite the semiconductor layer structure 150. The gate electrode 172 may include, for example, a silicide, doped polycrystalline silicon (poly-Si or poly), and/or a stable conductor. Though the gate electrode 172 and the gate insulating pattern 170 are illustrated as having coplanar sidewalls, the embodiments described herein are not limited thereto. In some embodiments, for example, the gate insulating pattern 170 may extend out from the gate electrode 172. In some embodiments, for example, the gate electrode 172 may extend out from the gate insulating pattern 170.

The semiconductor layer structure 150 of FIG. 2A is merely an example, and other configurations of the semiconductor layer structure 150 may be used without deviating from the embodiments described herein. For example, the embodiments described herein may be utilized in semiconductor devices which are gate-controlled, including semiconductor layer structures 150 that are controlled by gate electrodes utilizing a metal-oxide and/or metal-insulator interface, such as a MOSFET, MISFET, or an IGBT device, to name a few. Thus, it will be understood that the semiconductor layer structure 150 can take multiple other forms without deviating from the embodiments described herein.

An interface layer 280 may be disposed between the gate insulating pattern 170 and the semiconductor layer structure 150. In some embodiments, the interface layer 280 may include H, N, B, P, La, Sr, and/or Ba, or compounds containing these elements. The interface layer 280 may include an interface control and/or interface passivating material. The interface layer 280 can be applied or deposited as an element, as an oxide, as a silicate, and/or as a carbonate compound. In some embodiments, the interface layer 280 can be applied by an anneal in a gaseous state. Passivation elements of the interface layer 280 may be that of a single element, or multiple passivation elements may be present. The interface layer 280 may be applied in a single step, or applied through multiple processing steps.

Figure 2B:
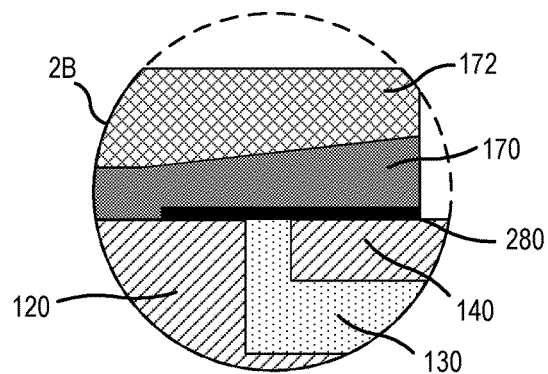
FIG. 2B is a schematic cross-sectional view of region 2B of FIG. 2A.

An interface passivation agent of the interface layer 280 may enhance oxidation, leaving a slightly thicker gate insulating pattern 170 under edges of the gate electrode 172. For example, in some embodiments, portions of the gate insulating pattern 170 may have a bow-tie shape, with ends of the gate insulating pattern 170 being thicker than a middle of the gate insulating pattern 170. FIG. 2B is a schematic cross-sectional view of the region 2B of FIG. 2A. FIG. 2B illustrates that, in some embodiments, the edge of the gate insulating pattern 170 may be thicker than a center portion of the gate insulating pattern 170 as a result of the interface layer 280. In some embodiments, the gate insulating pattern 170 may be thicker in regions that are over/contacting the interface layer 280 than in regions that are not over/contacting the interface layer 280.

The interface layer 280 may include a plurality of segments. For example, the interface layer 280 may include a first segment 280a adjacent a first edge of the gate electrode 172 and/or gate insulating pattern 170 and a second segment 280b adjacent a second edge of the gate electrode 172 and/or gate insulating pattern 170.

In some embodiments, the first segment 280a of the interface layer 280 may extend from a first sidewall 170a of the gate insulating pattern 170 towards a center portion 170c of the gate insulating pattern 170. The center portion 170c of the gate insulating pattern 170 may be over the JFET region of the semiconductor layer structure 150. At least a portion of the first segment 280a may be disposed between the gate insulating pattern 170 and an upper surface of the semiconductor layer structure 150 in a direction (e.g., a vertical direction) that is perpendicular to the upper surface of the semiconductor layer structure 150. In some embodiments, the first segment 280a may extend between the gate insulating pattern 170 and a portion of the source/drain region 140, a portion of a p-well 130, and/or a portion of the drift layer 120. In some embodiments, the first segment 280a may extend over a portion of the JFET region, but may not extend between at least a portion of the interface between the JFET region and the gate insulating pattern 170.

In some embodiments, the second segment 280b of the interface layer 280 may extend from a second sidewall 170b of the gate insulating pattern 170 towards the center portion 170c of the gate insulating pattern 170. The second sidewall 170b of the gate insulating pattern 170 may be on an opposite side of the gate insulating pattern 170 and/or the JFET region from the first sidewall 170a of the gate insulating pattern 170. At least a portion of the second segment 280b may be disposed between the gate insulating pattern 170 and an upper surface of the semiconductor layer structure 150 in the direction (e.g., the vertical direction) that is perpendicular to the upper surface of the semiconductor layer structure 150. In some embodiments, the second segment 280b may extend between the gate insulating pattern 170 and a portion of the source/drain region 140, a portion of a p-well 130, and/or a portion of the drift layer 120. In some embodiments, the second segment 280b may extend over a portion of the JFET region, but may not extend between at least a portion of the interface between the JFET region and the gate insulating pattern 170.

In some embodiments, the first segment 280a and the second segment 280b of the interface layer 280 may be substantially coplanar. Thus, the first segment 280a and the second segment 280b of the interface layer 280 may extend collinearly with a gap therebetween. In some embodiments, the first segment 280a and the second segment 280b of the interface layer 280 may be composed of substantially the same materials, though the embodiments described herein are not limited thereto.

In some embodiments, a doping concentration of the first segment 280a and/or the second segment 280b of the interface layer 280 may vary along a length thereof. For example, a doping concentration of the first segment 280a may be highest near the first sidewall 170a of the gate insulating pattern 170 and may decrease as the first segment 280a extends towards the center portion 170c of the gate insulating pattern 170, though the embodiments described herein are not limited thereto. The change in the doping concentration of the first segment 280a as the first segment 280a extends towards the center can be linear, exponential, step, random, etc., as it goes from highest doping concentration to a lowest doping concentration (e.g., from edge to center). The doping concentration of the second segment 280b may be similar to that of the first segment 280a, but the embodiments described herein are not limited thereto. In some embodiments, the second segment 280b may have a different distribution of dopant concentration than the first segment 280a. In some embodiments, a portion of the first segment 280a and/or the second segment 280b of the interface layer 280 having the highest doping concentration may be between the sidewalls 170a, 170b of the gate insulating pattern 170 and the center portion 170c of the gate insulating pattern 170.

In some embodiments, at least a portion of the upper surface of the semiconductor layer structure 150 beneath the center portion 170c of the gate insulating pattern 170 (e.g., a portion over the JFET region of the semiconductor layer structure 150) may be free of the interface layer 280. Thus, a portion of the interface between the gate insulating pattern 170 and the JFET region of the semiconductor layer structure 150 may not have the interface layer 280 therebetween.

The interface layer 280 may include a center portion with edge portions on either side of the center portion. The center portion of the interface layer 280 may be below the center portion 170c of the gate insulating pattern 170 and the edge portions of the interface layer 280 may be near the sidewalls 170a, 170b of the gate insulating pattern 170. The first segment 280a and the second segment 280b may be in the edge portions and may extend towards the center portion.

Figure 2C:
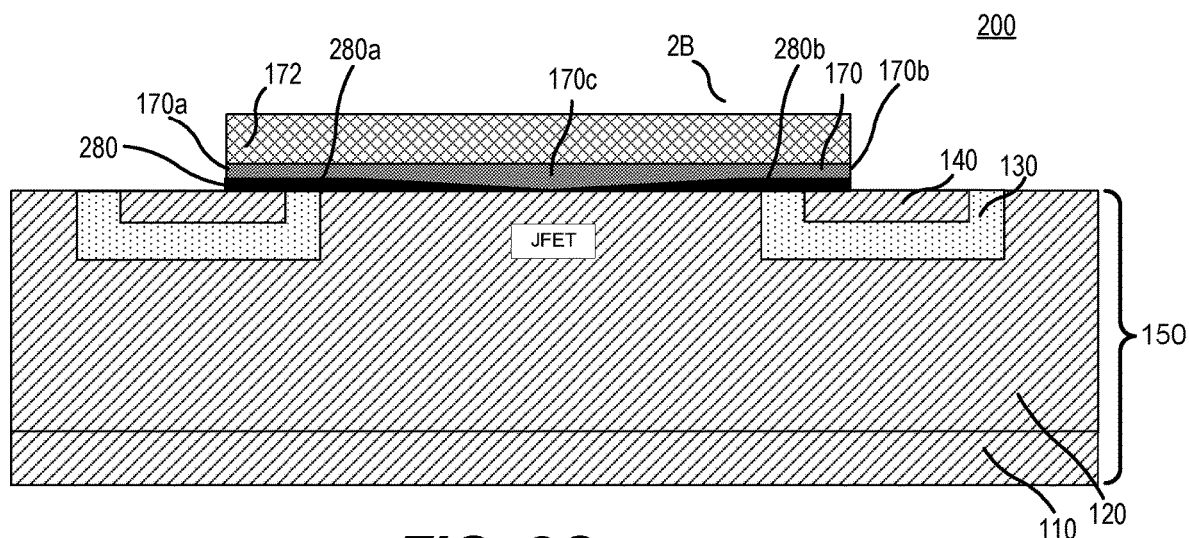
FIG. 2C is a schematic cross-sectional diagram of an additional embodiment of a semiconductor device, according to some embodiments described herein.

In some embodiments, portions of the interface layer 280 may be present between the first segment 280a and the second segment 280b, although such portions may have a lower dopant concentration and/or thickness than the first segment 280a and the second segment 280b. For example, in some embodiments, the first segment 280a may extend from the edge portion of the interface layer 280 to meet the second segment 280b near the center portion of the interface layer 280, with the portion of the interface layer 280 over the JFET region (e.g., the center portion of the interface layer 280) having a lowest dopant concentration of the interface layer 280. FIG. 2C illustrates an additional embodiment according to the present invention in which the first segment 280a and the second segment 280b meet near the center portion 170c of the gate insulating pattern 170 (e.g., a portion over the JFET region of the semiconductor layer structure 150). FIG. 2C schematically shows that the thickness and/or dopant concentration of the interface layer 280 may diminish over the JFET region.

Though not illustrated in FIG. 2A, portions of the interface layer 280 may also be present between the gate insulating pattern 170 and the gate electrode 172 in some embodiments. In some embodiments, a portion of the interface layer 280 may extend from the first sidewall 170a of the gate insulating pattern 170 between the gate insulating pattern 170 and the gate electrode 172 and above the first segment 280a. In some embodiments, another portion of the interface layer 280 may extend from the second sidewall 170b of the gate insulating pattern 170 between the gate insulating pattern 170 and the gate electrode 172 and above the second segment 280b.

By omitting the interface layer 280 over the JFET region, the interface layer 280 may not be present at the portion of the semiconductor device 200 where electrical fields may be highest. As a result, the semiconductor device 200 may exhibit better gate reliability during high-field blocking in the device off-state, while gaining the advantage of the interface control element being present where it is needed for low on-state resistance.

Various methods can be used to form the interface layer 280. Embodiments of the methods described herein include depositing material, such as the gate insulating pattern 170 and/or the gate electrode 172, over the gate region before adding interface control/passivation elements or patterning the interface passivation materials/elements to form the interface layer 280. For example, after a gate insulating pattern 170 is deposited, and the gate electrode is etched, an interface control element (such as P, B, Sr, La, or Ba) may be deposited on the adjacent regions, and an anneal may be used to diffuse the element laterally into the channel region. In this way, the middle of the gate electrode region over the JFET region can be free of interface control element.

Figure 3A:
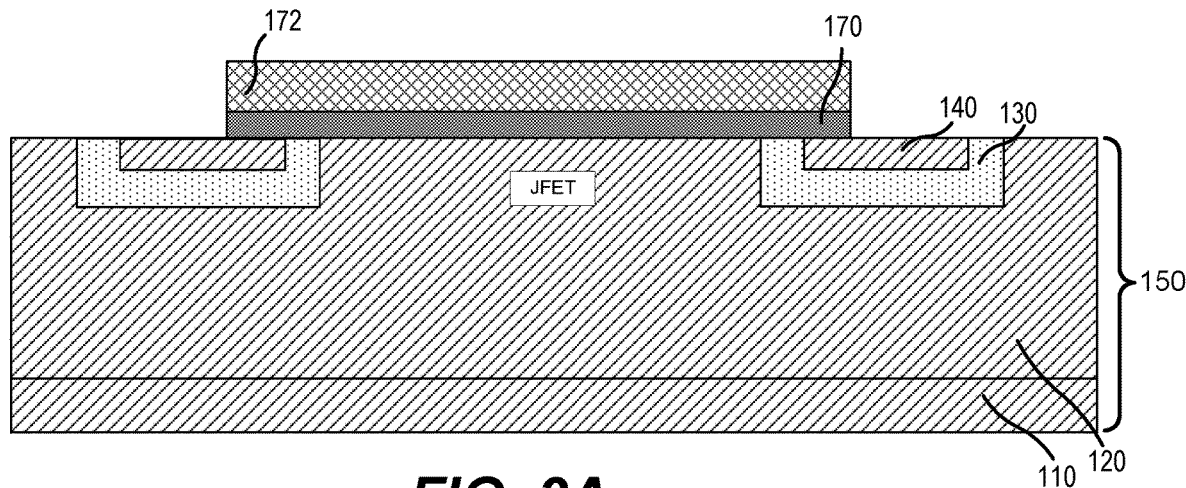
FIGS. 3A to 12E illustrate various embodiment of methods of manufacturing semiconductor devices according to some embodiments described herein.
Figure 3B:
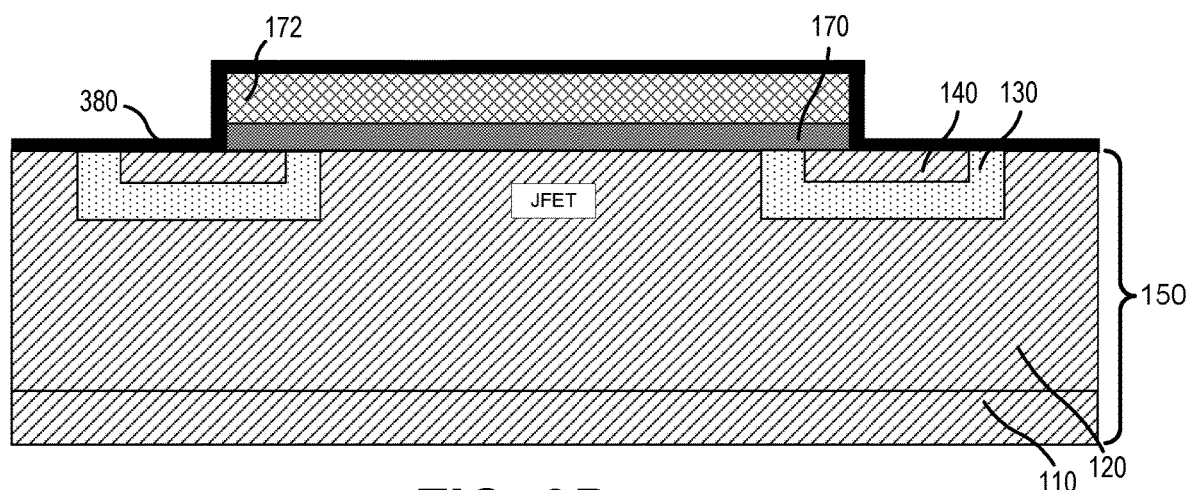
Figure 3C:
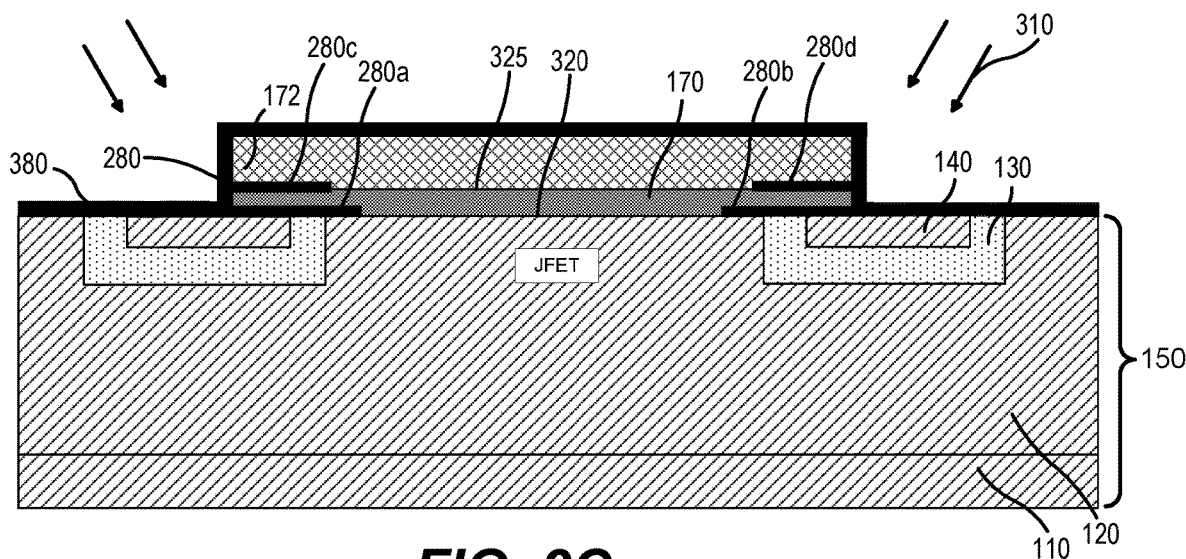

FIGS. 3A to 3C illustrate an embodiment of a method of manufacturing semiconductor devices according to embodiments described herein.

Referring to FIG. 3A, the semiconductor layer structure 150 may be formed. For example, a substrate 110 is provided and a drift layer 120 is formed on the substrate 110 via epitaxial growth. In some embodiments, the substrate 110 is a heavily-doped ($n^+$) n-type silicon carbide substrate and the drift layer 120 is a lightly-doped ($n^-$) silicon carbide drift layer 120, though the embodiments described herein are not limited thereto. In some embodiments, an n-type silicon carbide current spreading layer may be formed that comprises the upper portion of the drift layer 120.

Additional elements of the semiconductor layer structure 150 may be formed in the drift layer 220. For example, p-wells 130 may be formed and heavily-doped ($n^+$) n-type silicon carbide source/drain regions 140 may be formed in upper portions of the p-wells 130. The heavily-doped ($n^+$) n-type silicon carbide regions 140 act as source/drain regions 140 for the semiconductor device 200. In some embodiments, ion implantation may be used to form the p-wells 130 and the n-type source/drain regions 140.

A gate insulating layer may be formed on the upper surface of the semiconductor layer structure 150. A gate electrode layer may be formed on the gate insulating layer. The gate insulating layer and the gate electrode layer may be patterned and etched to form gate insulating pattern 170 and gate electrode 172. The gate insulating pattern 170 and gate electrode 172 may be formed over the exposed portions of the drift layer 120 between the p-wells 130 and n-type source/drain regions 140 and may extend onto the edges of the p-wells 130 and n-type source/drain regions 140. Though the gate electrode 172 and the gate insulating pattern 170 are illustrated as having coplanar sidewalls, the embodiments described herein are not limited thereto. In some embodiments, for example, the gate insulating pattern 170 may extend out from the etched gate electrode 172.

Referring to FIG. 3B, interface material 380 may be formed on the gate insulating pattern 170 and gate electrode 172. In some embodiments, the interface material 380 may include H, N, B, P, La, Sr, and/or Ba or compounds containing these elements. The interface material 380 may include an interface control and/or interface passivating material. The interface material 380 can be applied or deposited as an element, as an oxide, as a silicate, and/or as a carbonate compound. In some embodiments, the interface material 380 can be applied by an anneal in a gaseous state. An interface passivation agent of the interface material 380 may enhance oxidation, leaving a slightly thicker gate insulating pattern 170 under edges of the gate electrode 172. Passivation elements of the interface material 380 may be that of a single element, or multiple passivation elements may be present. The interface material 380 may be applied in a single step, or applied through multiple processing steps. The interface material 380 may be disposed on, for example, a top surface of the gate electrode 172, sidewalls of the gate electrode 172, sidewalls of the gate insulating pattern 170, and a top surface of the semiconductor layer structure 150. In some embodiments, the interface material 380 may be selectively deposited and/or patterned near an interface between the gate insulating pattern 170 and a top surface of the semiconductor layer structure 150.

Referring to FIG. 3C, an anneal operation 310 is performed. The anneal may be performed, for example, at a temperature of between 400° C. and 1300° C. The temperature used for the anneal process may depend on the materials used for the interface layer 280. The anneal may be performed, for example, in an inert environment or an oxidizing environment. As a result of the anneal operation 310, portions of the interface material 380 may diffuse into the interface 320 between the gate insulating pattern 170 and semiconductor layer structure 150 from the edges of the gate insulating pattern 170. The portions of the interface material 380 that diffuse into the interface 320 may form the first segment 280a and the second segment 280b of the interface layer 280.

Though not shown in the device of FIG. 2A, FIG. 3C illustrates that, in some embodiments, the interface material 380 may also diffuse into the interface 325 between the gate electrode 172 and the gate insulating pattern 170. Therefore, in some embodiments, third segment 280c and fourth segment 280d of the interface layer 280 may also be formed between the gate electrode 172 and the gate insulating pattern 170.

As is recognized by the inventors, diffusion of dopant materials along an interface can be more efficient than bulk diffusion by up to one hundred times or more, especially using SiC. As a result, the interface layer 280 may be formed without substantial diffusion of the interface material 380 into other portions of the device. A duration of the anneal operation 310 may be controlled so as to allow enough diffusion to extend the interface layer 280 from the edges of the gate insulating pattern 170 toward the center of the gate insulating pattern 170 without extending over the center of the JFET region.

Figure 3D:
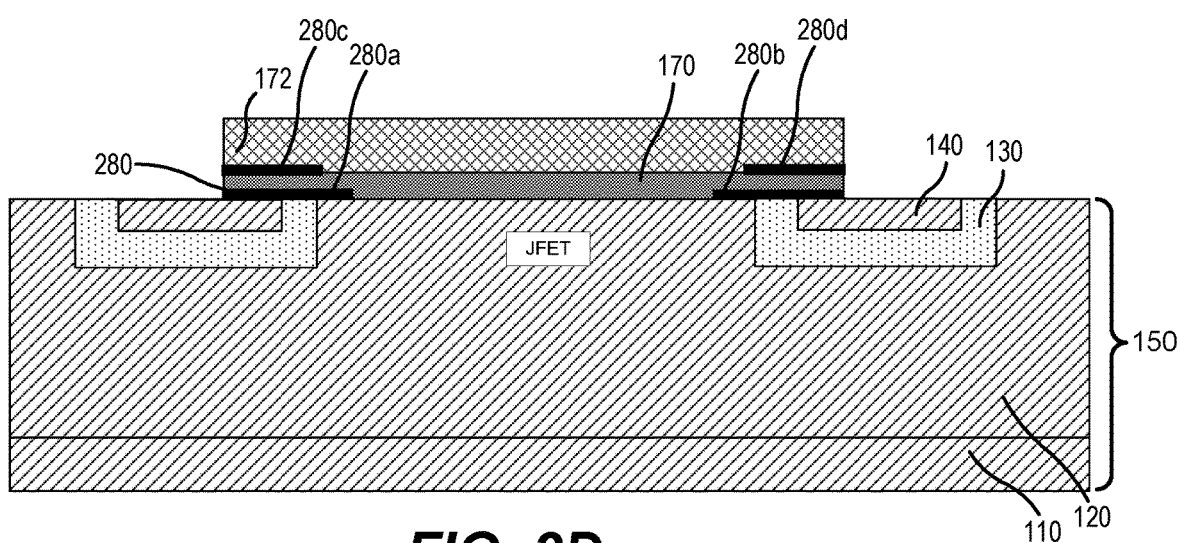

After the anneal operation 310 is complete, the exposed interface material 380 may be removed from the device (e.g., by etching) to leave the semiconductor device 200 illustrated in FIG. 3D. As illustrated in FIG. 3D, the interface layer 280 may remain between the gate insulating pattern 170 and the semiconductor layer structure 150 (as first segment 280a and second segment 280b) and between the gate electrode 172 and the gate insulating pattern 170 (as third segment 280c and fourth segment 280d). In some embodiments, the first segment 280a may be separated from the second segment 280b by a gap and the third segment 280c may be separated from the fourth segment 280d by a gap. In some embodiments, the pairs of segments may meet together over the JFET region such that the portion of the interface layer 280 over the JFET region has a low dopant concentration and/or thickness (similar to that illustrated in FIG. 2C). In some embodiments, the third segment 280c and the fourth segment 280d may not be present.

FIGS. 4A to 4E illustrate an embodiment of a method of manufacturing semiconductor devices according to embodiments described herein. A description of those elements of FIGS. 4A to 4E that are the same or similar to those previously discussed will be omitted for brevity. Accordingly, the description of FIGS. 4A to 4E will focus on differences from what has been previously described.

Figure 4A:
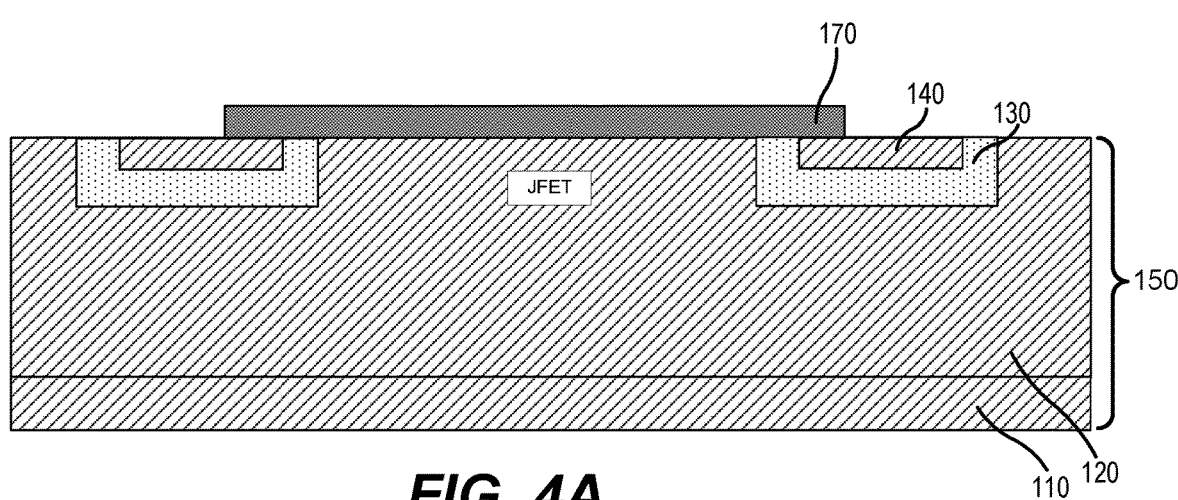

Referring to FIG. 4A, a gate insulating layer may be formed on the upper surface of a semiconductor layer structure 150 and patterned to form gate insulating pattern 170. The gate insulating pattern 170 may be formed over the exposed portions of the drift layer 120 between the p-wells 130 and n-type source/drain regions 140 and extend onto the edges of the p-wells 130 and n-type source/drain regions 140.

Figure 4B:
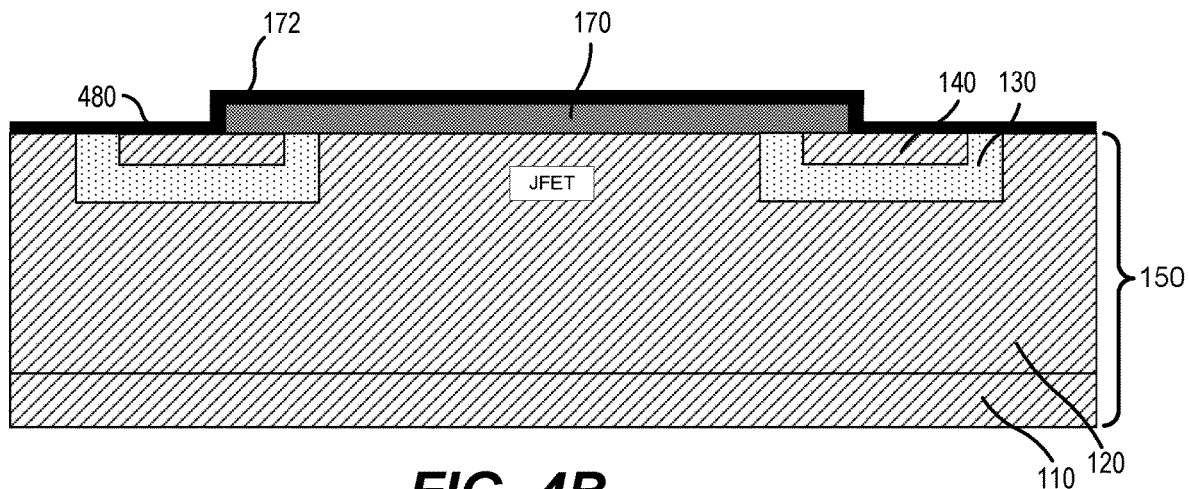

Referring to FIG. 4B, interface material 480 may be formed on the gate insulating pattern 170. In some embodiments, the interface material 480 may include H, N, B, P, La, Sr, and/or Ba or compounds containing these elements. The interface material 480 may include an interface control and/or interface passivating material. The interface material 480 can be applied or deposited as an element, as an oxide, as a silicate, and/or as a carbonate compound. In some embodiments, the interface material 480 can be applied by an anneal in a gaseous state. An interface passivation agent of the interface material 480 may enhance oxidation, leaving a slightly thicker gate insulating pattern 170 under edges of a later-formed gate electrode. Passivation elements of the interface material 480 may be that of a single element, or multiple passivation elements may be present. The interface material 480 may be applied in a single step, or applied through multiple processing steps. The interface material 480 may be disposed on, for example, a top surface and sidewalls of the gate insulating pattern 170 and a top surface of the semiconductor layer structure 150.

Figure 4C:
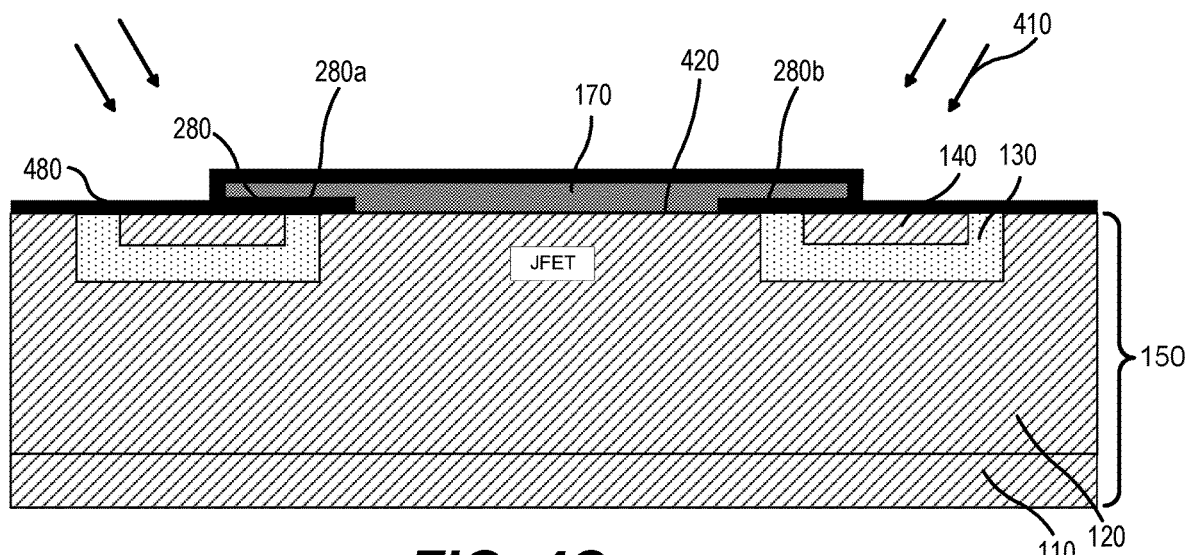

Referring to FIG. 4C, an anneal operation 410 is performed. As a result of the anneal operation 410, portions of the interface material 480 may diffuse into the interface 420 between the gate insulating pattern 170 and the semiconductor layer structure 150 from the edges of the gate insulating pattern 170. The portions of the interface material 480 that diffuse into the interface 420 may form interface layer 280. A duration of the anneal operation 410 may be controlled so as to allow enough diffusion to extend the interface layer 280 from the edges of the gate insulating pattern 170 toward the center of the gate insulating pattern 170 without extending over the center of the JFET region.

Figure 4D:
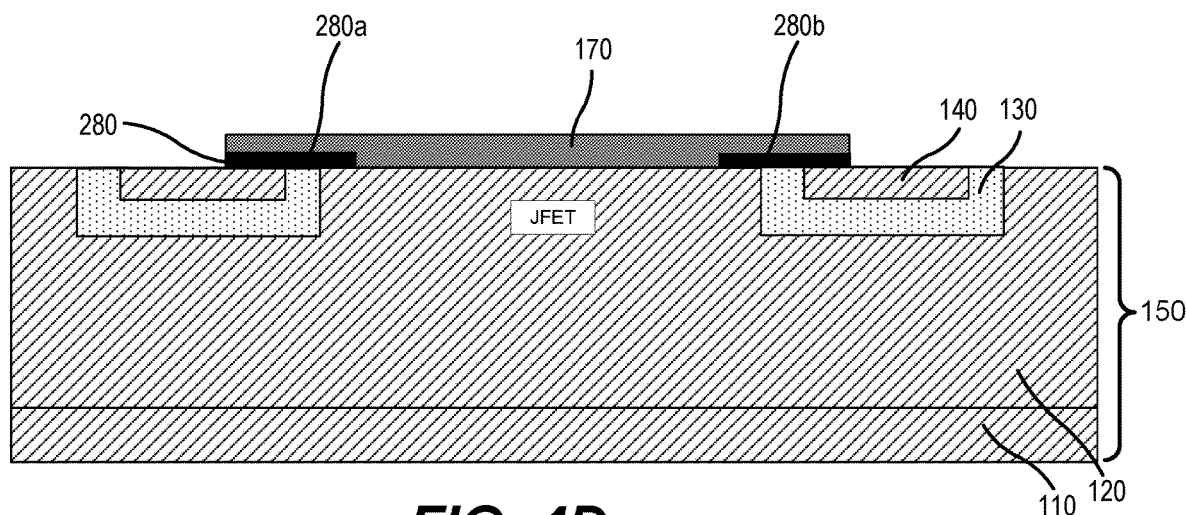

Referring to FIG. 4D, after the anneal operation 410 is complete the excess interface material 480 may be removed (e.g., by etching) from the top surface and sidewalls of the gate insulating pattern 170 and the top surface of the semiconductor layer structure 150.

Figure 4E:
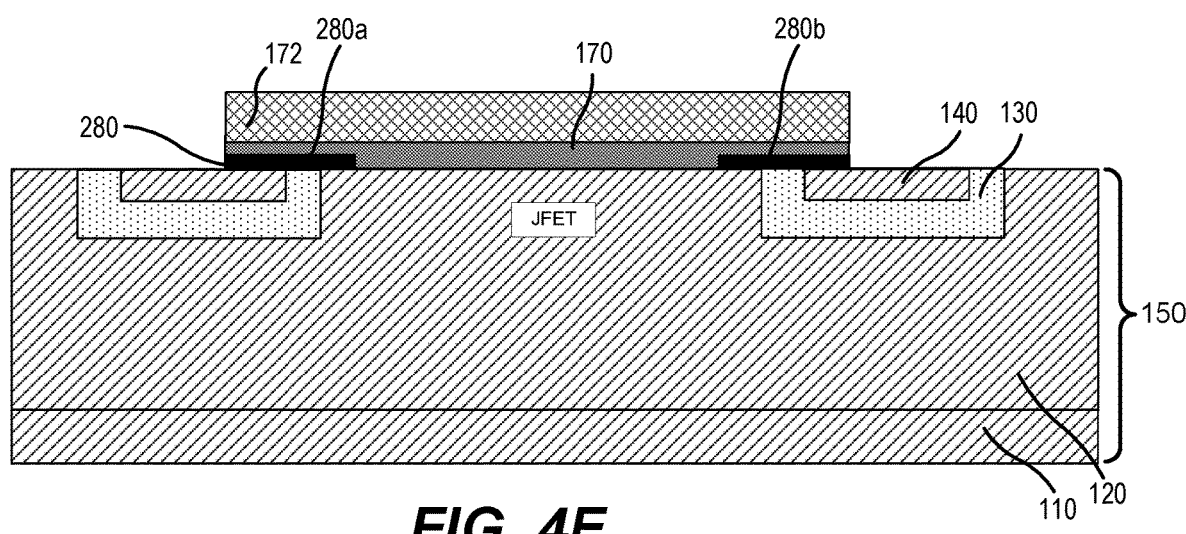

Referring to FIG. 4E, a gate electrode layer may be formed on the gate insulating layer 270. The gate insulating layer may be patterned and etched to form gate electrode 172. Though the gate electrode 172 and the gate insulating pattern 170 are illustrated as having coplanar sidewalls, the embodiments described herein are not limited thereto. In some embodiments, for example, the gate insulating pattern 170 may extend out from the etched gate electrode 172. The embodiment illustrated in FIGS. 4A-4E may avoid disposing elements of the interface layer 280 between the gate insulating pattern 170 and the gate electrode 172 (e.g., the third segment 280c and fourth segment 280d of FIG. 3C).

FIGS. 5A to 5E illustrate an embodiment of a method of manufacturing semiconductor devices according to embodiments described herein. A description of those elements of FIGS. 5A to 5E that are the same or similar to those previously discussed will be omitted for brevity. Accordingly, the description of FIGS. 5A to 5E will focus on differences from what has been previously described.

Figure 5A:
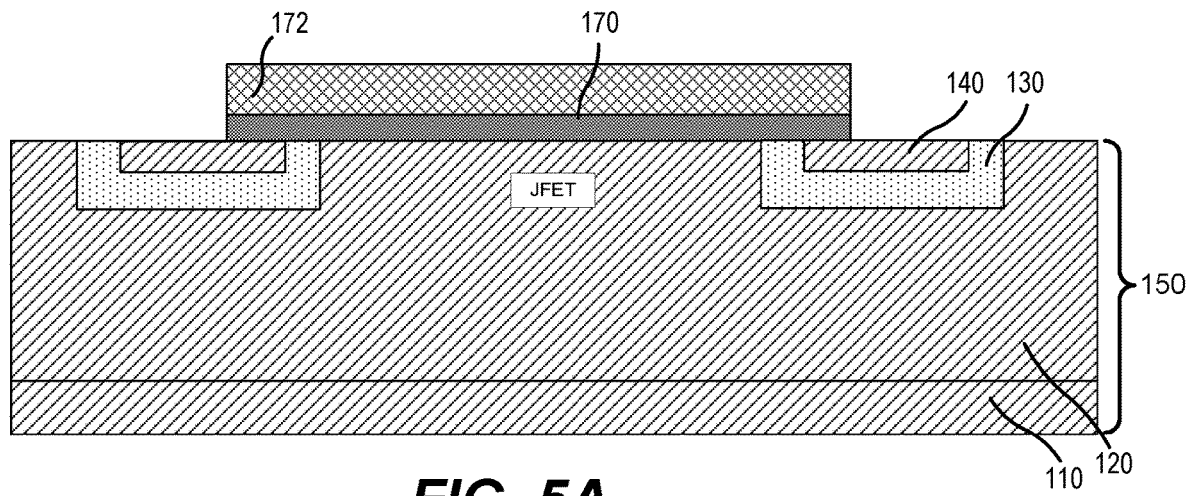

Referring to FIG. 5A, a gate insulating layer may be formed on the upper surface of a semiconductor layer structure 150. A gate electrode layer may be formed on the gate insulating layer. The gate insulating layer and the gate electrode layer may be patterned and etched to form gate insulating pattern 170 and gate electrode 172. The gate insulating pattern 170 and gate electrode 172 may be formed over the exposed portions of the drift layer 120 between the p-wells 130 and n-type source/drain regions 140 and extend onto the edges of the p-wells 130 and n-type source/drain regions 140. Though the gate electrode 172 and the gate insulating pattern 170 are illustrated as having coplanar sidewalls, the embodiments described herein are not limited thereto. In some embodiments, for example, the gate insulating pattern 170 may extend out from the etched gate electrode 172.

Figure 5B:
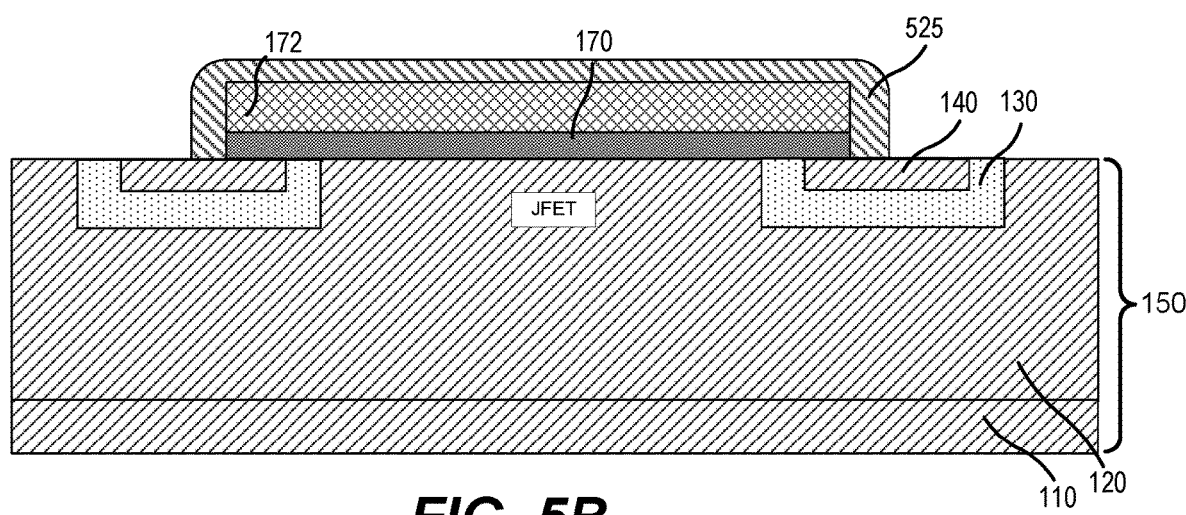

Referring to FIG. 5B, a protective dielectric barrier 525 (for example, $SiO_2$, SiON, $Si_xN_y$, $Al_2O_3$, etc.) may be formed on the gate insulating pattern 170 and the gate electrode 172. The protective dielectric barrier 525 may be formed, for example, by depositing a dielectric layer on the gate insulating pattern 170 and the gate electrode 172, and then patterning/etching the dielectric layer to form the protective dielectric barrier 525. In some embodiments, the protective dielectric barrier 525 may be thermally grown. The protective dielectric barrier 525 may be formed so as to have a sidewall adjacent a sidewall of the gate insulating pattern 170. In some embodiments, an interface between the protective dielectric barrier 525 and the semiconductor layer structure 150 may be substantially coplanar with an interface between gate insulating pattern 170 and the semiconductor layer structure 150.

Figure 5C:
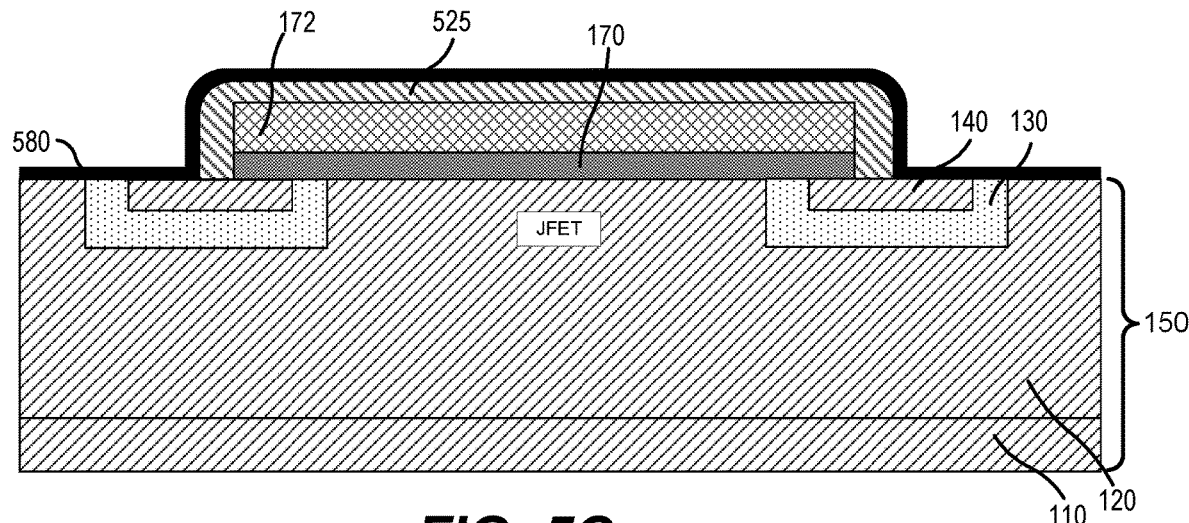

Referring to FIG. 5C, interface material 580 may be formed on the protective dielectric barrier 525. In some embodiments, the interface material 580 may include H, N, B, P, La, Sr, and/or Ba or compounds containing these elements. The interface material 580 may include an interface control and/or interface passivating material. The interface material 580 can be applied or deposited as an element, as an oxide, as a silicate, and/or as a carbonate compound. In some embodiments, the interface material 580 can be applied by an anneal in a gaseous state. An interface passivation agent of the interface material 580 may enhance oxidation, leaving a slightly thicker gate insulating pattern 170 under edges of the gate electrode 172. Passivation elements of the interface material 580 may be that of a single element, or multiple passivation elements may be present. The interface material 580 may be applied in a single step, or applied through multiple processing steps. The interface material 580 may be disposed on, for example, a top surface and sidewalls of the protective dielectric barrier 525 and a top surface of the semiconductor layer structure 150.

Figure 5D:
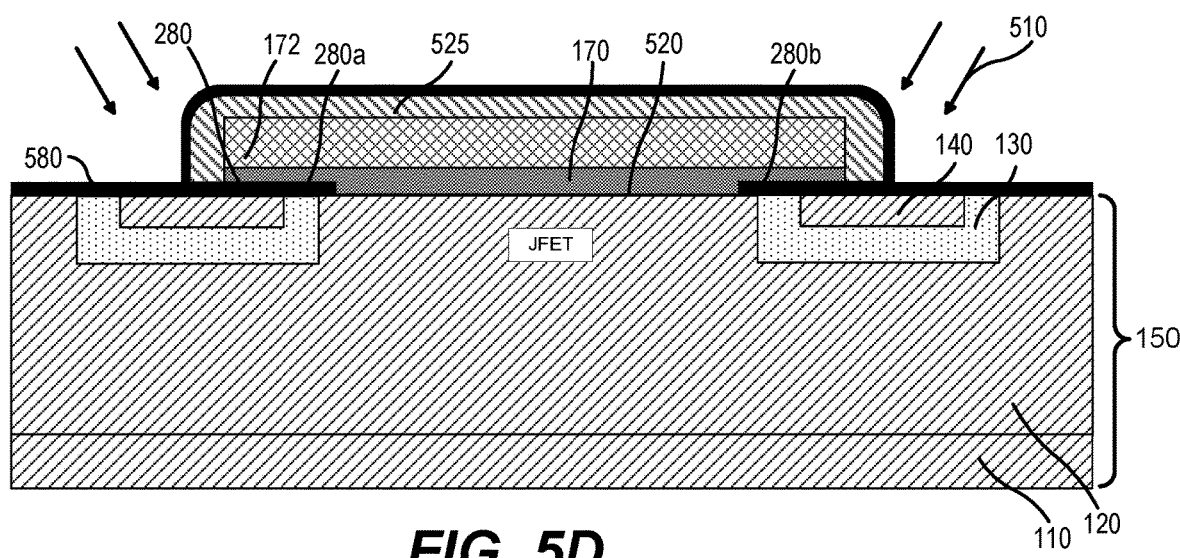

Referring to FIG. 5D, an anneal operation 510 is performed. As a result of the anneal operation 510, portions of the interface material 580 may diffuse into the interface 520 between the gate insulating pattern 170 and semiconductor layer structure 150 from the edges of the gate insulating pattern 170 and edges of the protective dielectric barrier 525. The portions of the interface material 580 that diffuse into the interface 520 may form interface layer 280. A duration of the anneal operation 510 may be controlled so as to allow enough diffusion to extend the interface layer 280 from the edges of the gate insulating pattern 170 and edges of the protective dielectric barrier 525 toward the center of the gate insulating pattern 170 without extending over the center of the JFET region. In some embodiments, the protective dielectric barrier 525 may protect surfaces of the gate electrode 172 during the anneal operation 510.

Figure 5E:
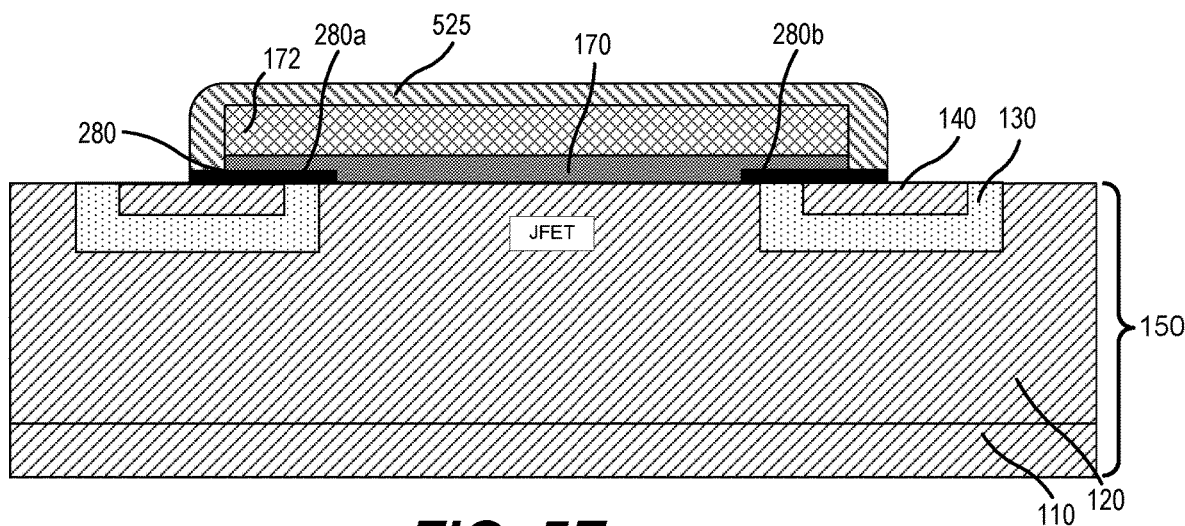

Referring to FIG. 5E, after the anneal operation 510 is complete, the excess interface material 580 may be removed from the protective dielectric barrier 525 (e.g., by etching). In some embodiments, the protective dielectric barrier 525 may remain in the final semiconductor device (e.g., semiconductor device 200). In some embodiments, the protective dielectric barrier 525 may be removed after the interface layer 280 is formed. The embodiment illustrated in FIGS. 5A-5E may avoid disposing elements of the interface layer 280 between the gate insulating pattern 170 and the gate electrode 172 (e.g., the third segment 280c and fourth segment 280d of FIG. 3C).

FIGS. 6A to 6E illustrate an embodiment of a method of manufacturing semiconductor devices according to embodiments described herein. A description of those elements of FIGS. 6A to 6E that are the same or similar to those previously discussed will be omitted for brevity. Accordingly, the description of FIGS. 6A to 6E will focus on differences from what has been previously described.

Figure 6A:
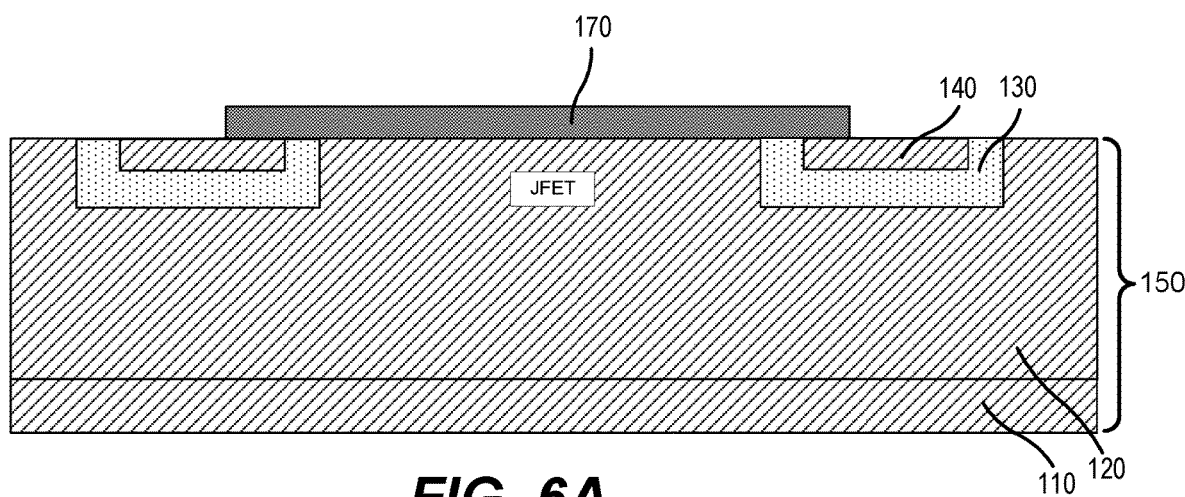

Referring to FIG. 6A, a gate insulating layer may be formed on the upper surface of a semiconductor layer structure 150 and patterned to form gate insulating pattern 170. The gate insulating pattern 170 may be formed over the exposed portions of the drift layer 120 between the p-wells 130 and n-type source/drain regions 140 and extend onto the edges of the p-wells 130 and n-type source/drain regions 140.

Figure 6B:
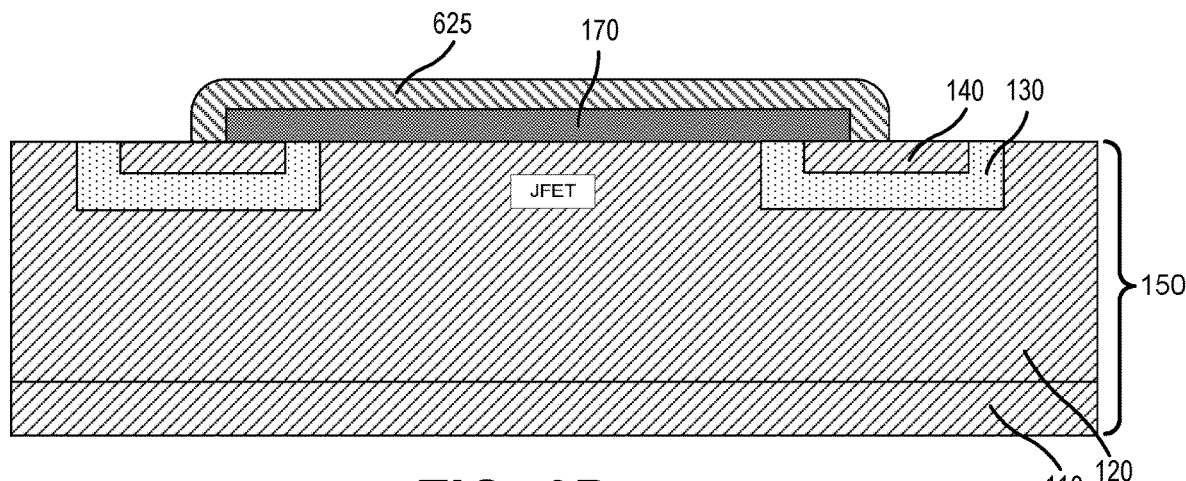

Referring to FIG. 6B, a protective dielectric barrier 625 (for example, $SiO_2$, SiON, $Si_xN_y$, $Al_2O_3$, etc.) may be formed on the gate insulating pattern 170. The protective dielectric barrier 625 may be formed, for example, by depositing a dielectric layer on the gate insulating pattern 170, and then patterning/etching the dielectric layer to form the protective dielectric barrier 625. In some embodiments, the protective dielectric barrier 625 may be thermally grown. The protective dielectric barrier 625 may be formed so as to have a sidewall adjacent a sidewall of the gate insulating pattern 170. In some embodiments, an interface between the protective dielectric barrier 625 and the semiconductor layer structure 150 may be substantially coplanar with an interface between gate insulating pattern 170 and the semiconductor layer structure 150.

Figure 6C:
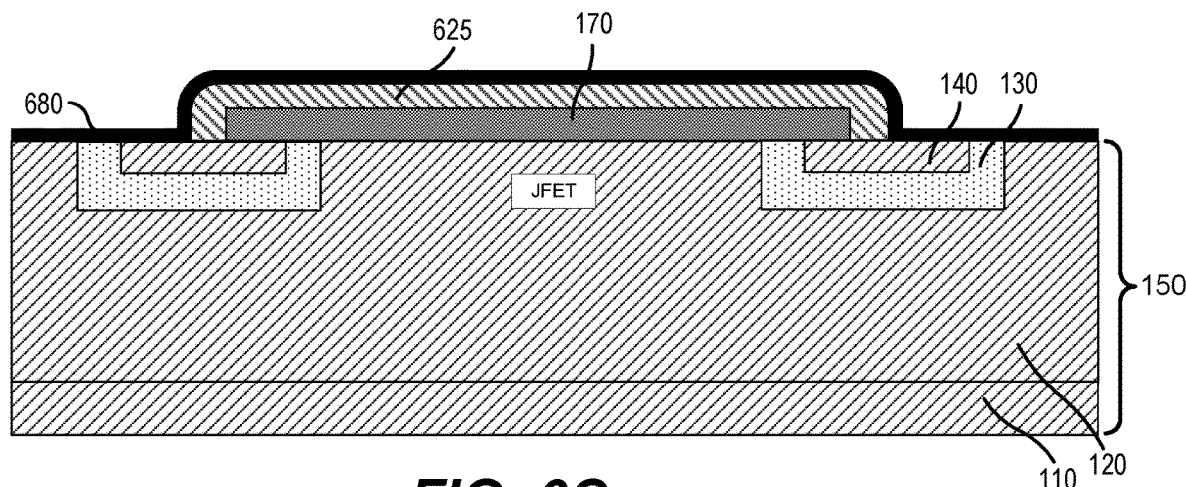

Referring to FIG. 6C, interface material 680 may be formed on the gate insulating pattern 170. In some embodiments, the interface material 680 may include H, N, B, P, La, Sr, and/or Ba or compounds containing these elements. The interface material 680 may include an interface control and/or interface passivating material. The interface material 680 can be applied or deposited as an element, as an oxide, as a silicate, and/or as a carbonate compound. In some embodiments, the interface material 680 can be applied by an anneal in a gaseous state. An interface passivation agent of the interface material 680 may enhance oxidation, leaving a slightly thicker gate insulating pattern 170 under edges of the gate electrode 172. Passivation elements of the interface material 680 may be that of a single element, or multiple passivation elements may be present. The interface material 680 may be applied in a single step, or applied through multiple processing steps. The interface material 680 may be disposed on, for example, a top surface and sidewalls of the protective dielectric barrier 625 and a top surface of the semiconductor layer structure 150.

Figure 6D:
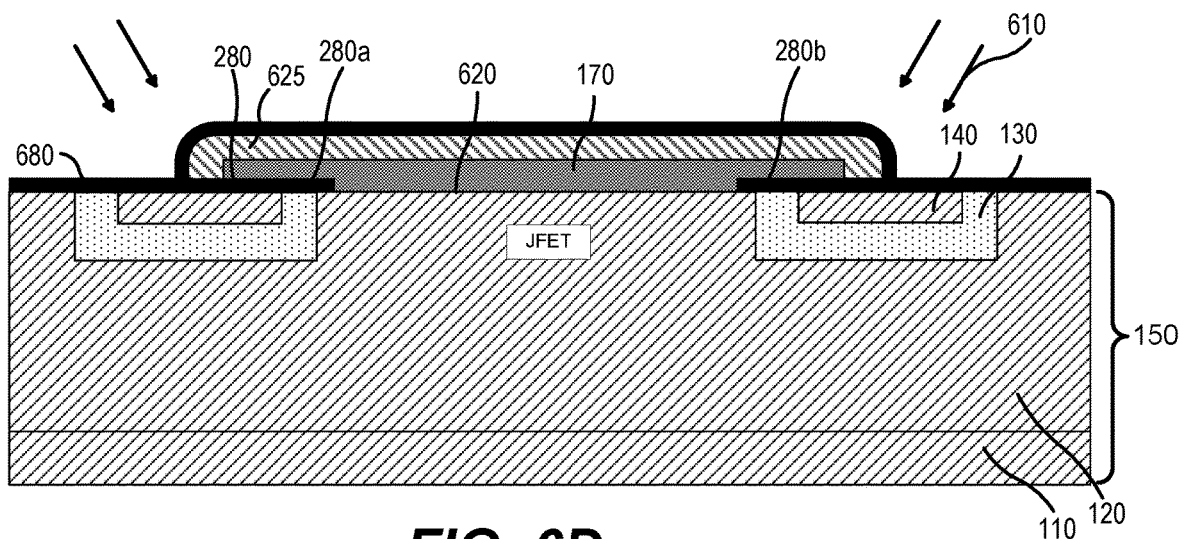

Referring to FIG. 6D, an anneal operation 610 is performed. As a result of the anneal operation 610, portions of the interface material 680 may diffuse into the interface 620 between the gate insulating pattern 170 and semiconductor layer structure 150 from the edges of the gate insulating pattern 170 and edges of the protective dielectric barrier 625. The portions of the interface material 680 that diffuse into the interface 620 may form interface layer 280. A duration of the anneal operation 610 may be controlled so as to allow enough diffusion to extend the interface layer 280 from the edges of the gate insulating pattern 170 and edges of the protective dielectric barrier 625 toward the center of the gate insulating pattern 170 without extending over the center of the JFET region. In some embodiments, the protective dielectric barrier 625 may protect surfaces of the gate insulating pattern 170 during the anneal operation 610.

Figure 6E:
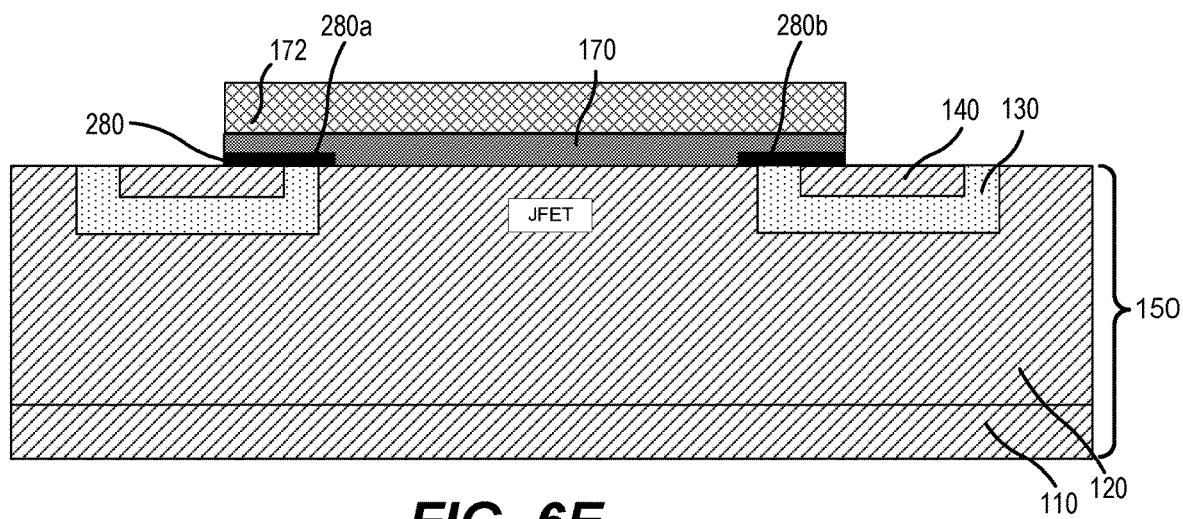

Referring to FIG. 6E, after the anneal operation 610 is complete, the protective dielectric barrier 625 and the excess interface material 680 may be removed (e.g., by etching) from the top surface and sidewalls of the gate insulating pattern 170. Subsequently, a gate electrode layer may be formed on the gate insulating pattern 170. The gate electrode layer may be patterned and etched to form gate electrode 172. Though the gate electrode 172 and the gate insulating pattern 170 are illustrated as having coplanar sidewalls, the embodiments described herein are not limited thereto. In some embodiments, for example, the gate insulating pattern 170 may extend out from the etched gate electrode 172. The embodiment illustrated in FIGS. 6A-6E may avoid disposing elements of the interface layer 280 between the gate insulating pattern 170 and the gate electrode 172 (e.g., the third segment 280c and fourth segment 280d of FIG. 3C).

FIGS. 7A to 7D illustrate an embodiment of a method of manufacturing semiconductor devices according to embodiments described herein. A description of those elements of FIGS. 7A to 7D that are the same or similar to those previously discussed will be omitted for brevity. Accordingly, the description of FIGS. 7A to 7D will focus on differences from what has been previously described.

Figure 7A:
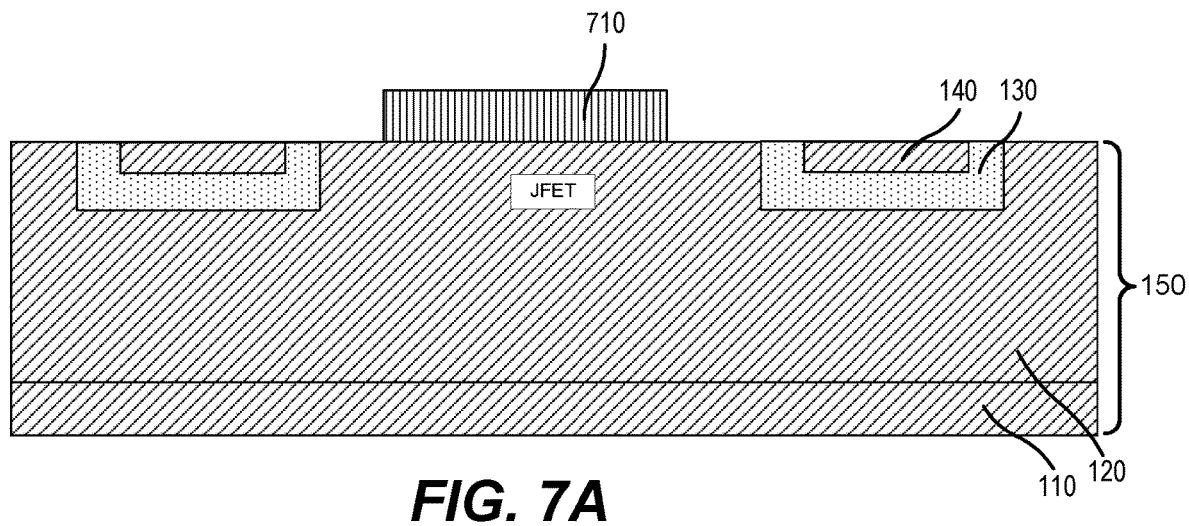

Referring to FIG. 7A, a dielectric layer may be formed (e.g., by deposit or by thermal growth) on the upper surface of a semiconductor layer structure 150 and patterned to form dielectric pattern 710. The dielectric pattern 710 may be formed over a central portion of the JFET region of the semiconductor layer structure 150. The dielectric pattern 710 may also be referred to herein as a blocking pattern. The dielectric pattern 710 may comprise a dielectric material such as, for example, for example, $SiO_2$, SiON, $Si_xN_y$, $Al_2O_3$, and the like.

Figure 7B:
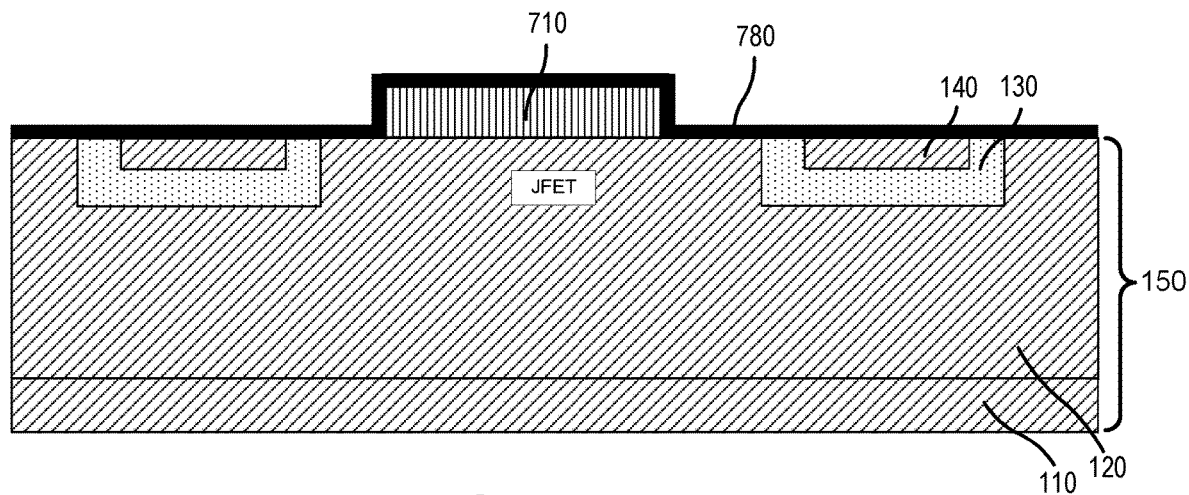

Referring to FIG. 7B, interface material 780 may be formed on the dielectric pattern 710. In some embodiments, the interface material 780 may include H, N, B, P, La, Sr, and/or Ba or compounds containing these elements. The interface material 780 may include an interface control and/or interface passivating material. The interface material 780 can be applied or deposited as an element, as an oxide, as a silicate, and/or as a carbonate compound. In some embodiments, the interface material 780 can be applied by an anneal in a gaseous state. Passivation elements of the interface material 780 may be that of a single element, or multiple passivation elements may be present. The interface material 780 may be applied in a single step, or applied through multiple processing steps. The interface material 780 may be disposed on, for example, a top surface and sidewalls of the dielectric pattern 710 and a top surface of the semiconductor layer structure 150.

Figure 7C:
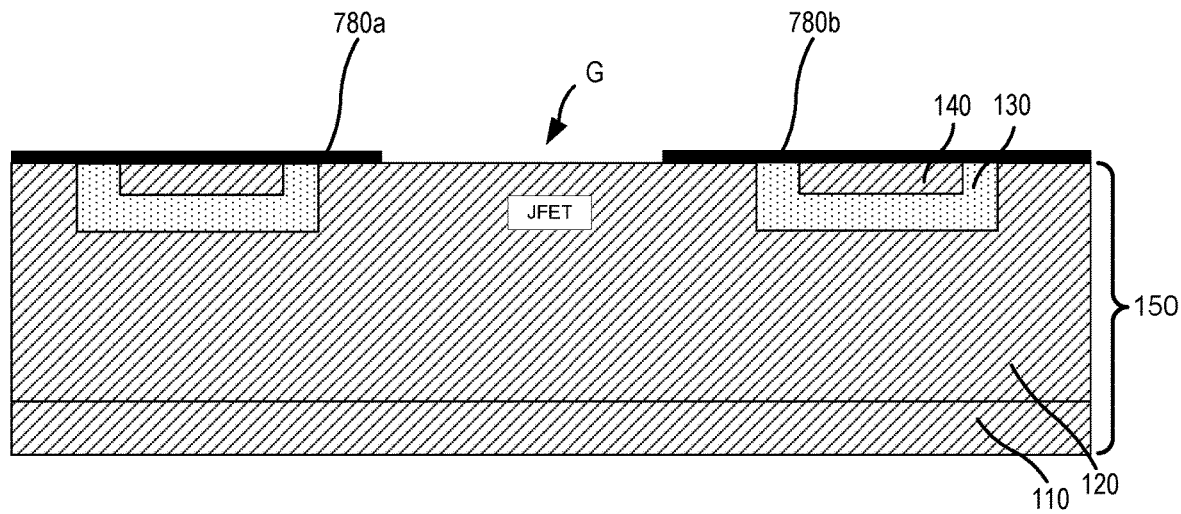

Referring to FIG. 7C, the dielectric pattern 710 may be removed and, along with it, portions of the interface material 780 on top and side surfaces of the dielectric pattern 710. The dielectric pattern 710 may be removed, for example, by etching or a lift-off process.

As a result of the removal of the dielectric pattern 710, the interface material 780 may be patterned to form a first segment 780a and a second segment 780b of the interface material 780, with a gap G therebetween. The gap G may be formed over the central portion of the JFET region of the semiconductor layer structure 150 previously occupied by the dielectric pattern 710.

Though the gap G between the first segment 780a and the second segment 780b of the interface material 780 is illustrated as being formed through the use of the dielectric pattern 710 in FIGS. 7A to 7C, it will be understood that other techniques are possible. For example, in some embodiments, the interface material 780 may be blanket deposited on the semiconductor layer structure 150 and then patterned/etched to form the gap G. In some embodiments, the first segment 780a and the second segment 780b of the interface material 780 may be formed by performing a shallow implant of the interface material 780 (e.g., using a pattern mask).

Figure 7D:
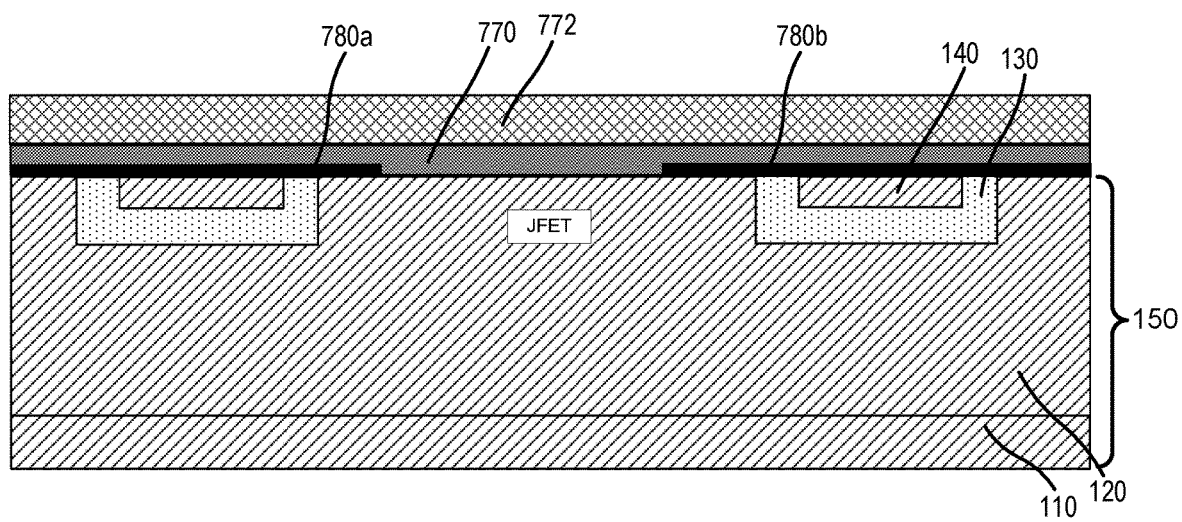

Referring to FIG. 7D, a gate insulating layer 770 may be formed on the upper surface of the first segment 780a of the interface material 780, the second segment 780b of the interface material 780, and the semiconductor layer structure 150. A gate electrode layer 772 may be formed on the gate insulating layer 770.

The gate insulating layer 770, the gate electrode layer 772, the first segment 780a of the interface material 780, and the second segment 780b of the interface material 780 may be patterned and etched to form gate insulating pattern 170, gate electrode 172, the first segment 280a of the interface layer 280, and the second segment 280b of the interface layer 280 as illustrated in FIG. 2A. The gate insulating pattern 170 and gate electrode 172 may be formed over the exposed portions of the drift layer 120 between the p-wells 130 and n-type source/drain regions 140 and extend onto the edges of the p-wells 130 and n-type source/drain regions 140. The embodiment illustrated in FIGS. 7A-7D may avoid disposing elements of the interface layer 280 between the gate insulating pattern 170 and the gate electrode 172 (e.g., the third segment 280c and fourth segment 280d of FIG. 3C).

FIGS. 8A to 8D illustrate an embodiment of a method of manufacturing semiconductor devices according to embodiments described herein. A description of those elements of FIGS. 8A to 8D that are the same or similar to those previously discussed will be omitted for brevity. Accordingly, the description of FIGS. 8A to 8D will focus on differences from what has been previously described.

Figure 8A:
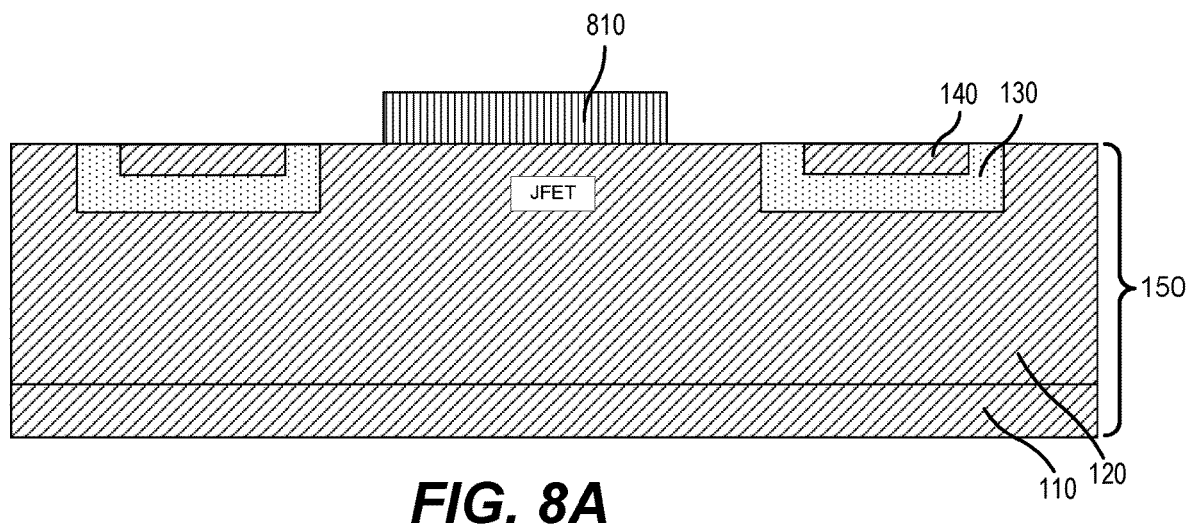

Referring to FIG. 8A, a dielectric layer may be formed (e.g., by deposit or by thermal growth) on the upper surface of a semiconductor layer structure 150 and patterned to form dielectric pattern 810. The dielectric pattern 810 may be formed over a central portion of the JFET region of the semiconductor layer structure 150. The dielectric pattern 810 may also be referred to herein as a blocking pattern.

Figure 8B:
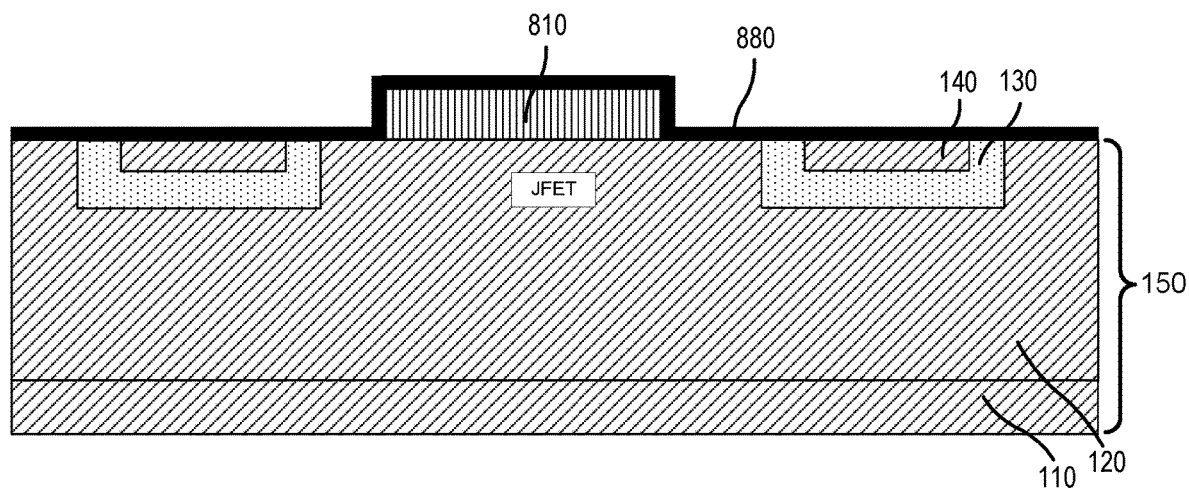

Referring to FIG. 8B, interface material 880 may be formed on the dielectric pattern 810. In some embodiments, the interface material 880 may include H, N, B, P, La, Sr, and/or Ba or compounds containing these elements. The interface material 880 may include an interface control and/or interface passivating material. The interface material 880 can be applied or deposited as an element, as an oxide, as a silicate, and/or as a carbonate compound. In some embodiments, the interface material 880 can be applied by an anneal in a gaseous state. Passivation elements of the interface material 880 may be that of a single element, or multiple passivation elements may be present. The interface material 880 may be applied in a single step, or applied through multiple processing steps. The interface material 880 may be disposed on, for example, a top surface and sidewalls of the dielectric pattern 810 and a top surface of the semiconductor layer structure 150.

Figure 8C:
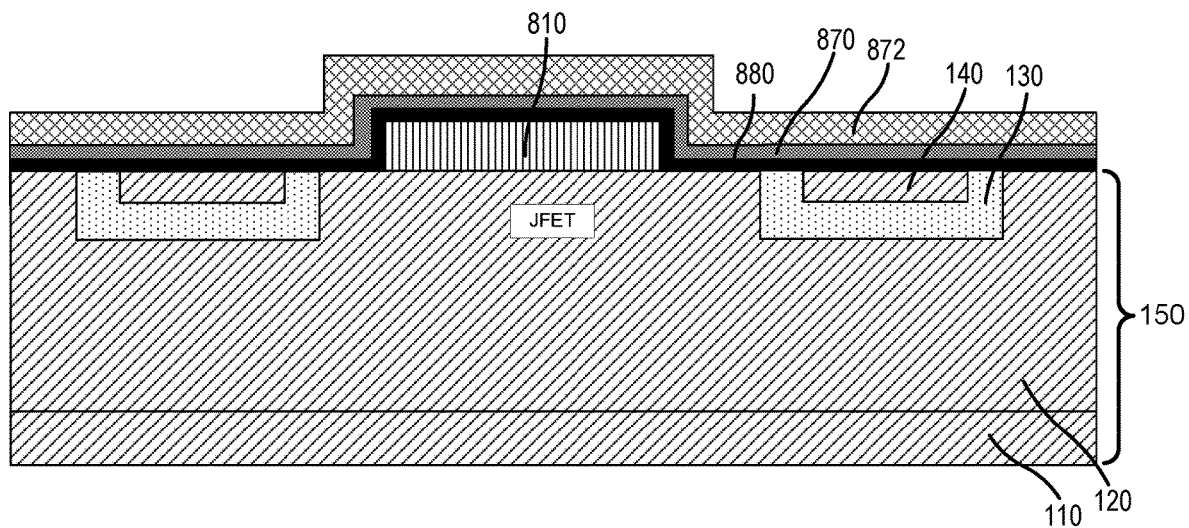

Referring to FIG. 8C, a gate insulating layer 870 may be formed on the upper surface of the interface material 880. A gate electrode layer 872 may be formed on the gate insulating layer 870.

Figure 8D:
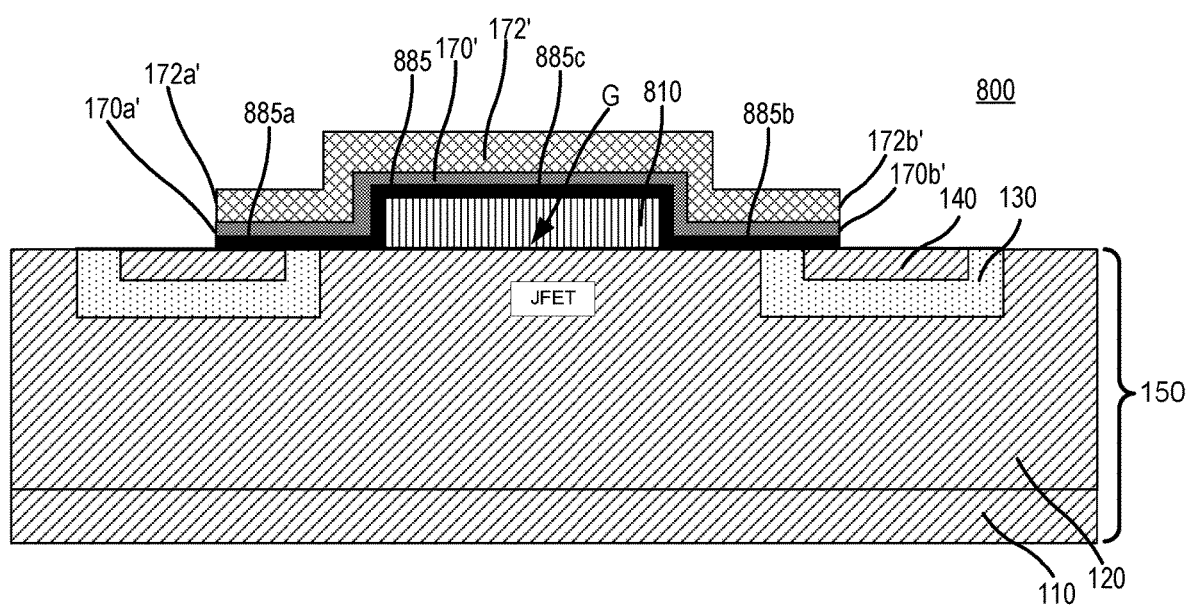

Referring to FIG. 8D, the gate insulating layer 870, the gate electrode layer 872, and the interface material 880 may be patterned and etched to form gate insulating pattern 170', gate electrode 172', and the interface layer 885 so as to form semiconductor device 800. Though the gate electrode 172' and the gate insulating pattern 170' are illustrated as having coplanar sidewalls, the embodiments described herein are not limited thereto. In some embodiments, for example, the gate insulating pattern 170' may extend out from the etched gate electrode 172'.

Semiconductor device 800 of FIG. 8D differs from the semiconductor device 200 of FIG. 2A in that it contains the dielectric pattern 810 over the central portion of the JFET region of the semiconductor layer structure 150.

As illustrated in FIG. 8D, the interface layer 885 may include a plurality of segments. For example, the interface layer 885 may include a first segment 885*a* adjacent a first edge of the gate electrode 172' and/or gate insulating pattern 170', a second segment 885*b* adjacent a second edge of the gate electrode 172' and/or gate insulating pattern 170', and a third segment 885*c* between the first segment 885*a* and the second segment 885*b*.

In some embodiments, the first segment 885*a* of the interface layer 885 may extend from a first sidewall 170*a'* of the gate insulating pattern 170' towards a center portion of the JFET region of the semiconductor layer structure 150 along the top surface of the semiconductor layer structure 150. At least a portion of the first segment 885*a* may be disposed between the gate insulating pattern 170' and an upper surface of the semiconductor layer structure 150 in a direction that is perpendicular to the upper surface of the semiconductor layer structure 150 (e.g., vertically). In some embodiments, the first segment 885*a* may extend between the gate insulating pattern 170' and a portion of the source/drain region 140, a portion of a p-well 130, and/or a portion of the drift layer 120. In some embodiments, the first segment 885*a* may extend over a portion of the JFET region, but may not extend between at least a portion of the interface between the JFET region and the dielectric pattern 810.

In some embodiments, the second segment 885*b* of the interface layer 885 may extend from a second sidewall 170*b'* of the gate insulating pattern 170' towards a center portion of the JFET region of the semiconductor layer structure 150 along the top surface of the semiconductor layer structure 150. The second sidewall 170*b'* of the gate insulating pattern 170' may be on an opposite side of the gate insulating pattern 170' and/or the JFET region from the first sidewall 170*a'* of the gate insulating pattern 170'. At least a portion of the second segment 885*b* may be disposed between the gate insulating pattern 170' and an upper surface of the semiconductor layer structure 150 in the direction that is perpendicular to the upper surface of the semiconductor layer structure 150 (e.g., vertically). In some embodiments, the second segment 885*b* may extend between the gate insulating pattern 170' and a portion of the source/drain region 140, a portion of a p-well 130, and/or a portion of the drift layer 120. In some embodiments, the second segment 885*b* may extend over a portion of the JFET region, but may not extend between at least a portion of the interface between the JFET region and the dielectric pattern 810.

In some embodiments, the third segment 885*c* of the interface layer 885 may extend along a top surface of the dielectric pattern 810. In some embodiments, the third segment 885*c* may extend over the JFET region, but the dielectric pattern 810 may be disposed between the third segment 885C and the JFET region. Thus, at least a portion of the upper surface of the semiconductor layer structure 150 over the center of the JFET region may be free of the interface layer 885. The dielectric pattern 810 may serve to protect the JFET region from degradation caused by the interface layer 885.

In some embodiments, the first segment 885*a* and the second segment 885*b* of the interface layer 885 may be substantially coplanar. Thus, the first segment 885*a* and the second segment 885*b* of the interface layer 885 may extend collinearly with a gap G therebetween. In some embodiments, the third segment 885*c* may not be coplanar with the first segment 885*a* and the second segment 885*b* of the interface layer 885. For example, the third segment 885*c* may extend at a level that is at a higher level (e.g., farther from the top surface of the semiconductor layer structure 150) than the first segment 885*a* and the second segment 885*b*. In some embodiments, the third segment 885*c* may be coupled to the first segment 885*a* and the second segment 885*b* by vertical segments of the interface layer 885 that extend on opposing sidewalls of the dielectric pattern 810.

In addition to the MOSFET devices described in the preceding figures, the present invention may also be applied to U-Shaped MOSFET (UMOSFET) devices. FIGS. 9A to 9D illustrate an embodiment of a method of manufacturing a UMOSFET semiconductor device 900 according to embodiments described herein.

Figure 9A:
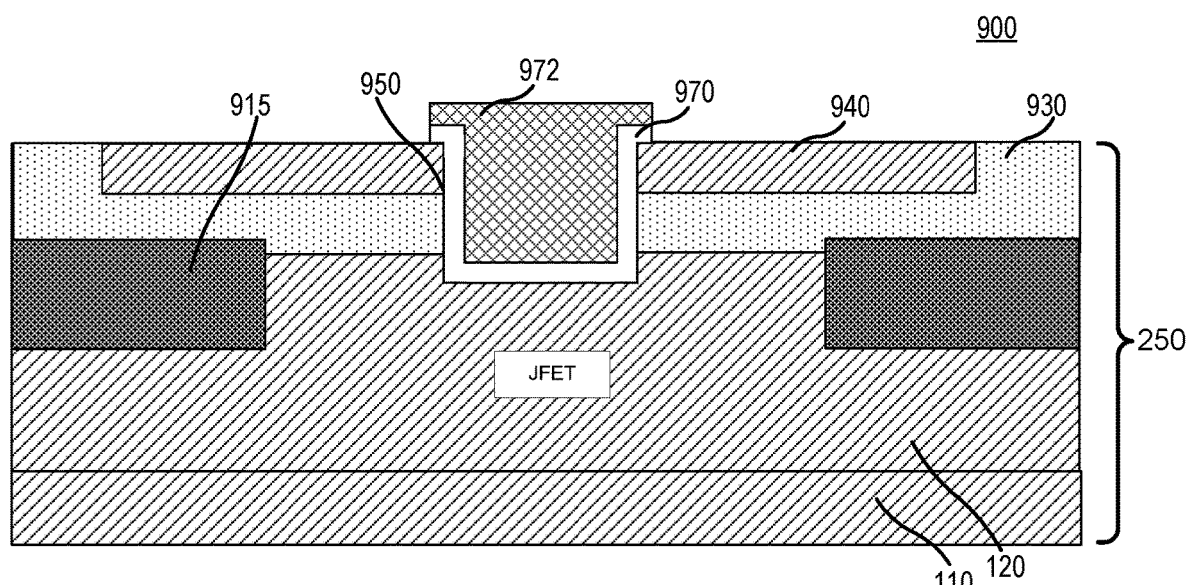

Referring to FIG. 9A, a semiconductor layer structure 250 may be formed. The semiconductor layer structure 250 may be part of a UMOSFET device 900. For example, a substrate 110 may be provided and a drift layer 120 may be formed on the substrate 110 via epitaxial growth. In some embodiments, the substrate 110 is a heavily-doped (n$^+$) n-type silicon carbide substrate and the drift layer 120 is a lightly-doped (n) silicon carbide drift layer 120, though the embodiments described herein are not limited thereto. In some embodiments, an n-type silicon carbide current spreading layer may be formed that comprises the upper portion of the drift layer 120.

Additional elements of the semiconductor layer structure 250 may be formed in the drift layer 120. For example, a p-type shield region 915 may be formed in the drift layer 120. P-wells 930 may be formed on the shield regions 915, and heavily-doped (n$^+$) n-type silicon carbide source/drain regions 940 may be formed in upper portions of the p-wells 930. In some embodiments, the p-type shield region 915, the p-wells 930, and the n-type source/drain regions 940 may be formed via ion implantation in the drift layer 120. In some embodiments, the p-type shield region 915 may be formed by ion implantation in an upper surface of the drift layer 120, and the p-wells 930 may be formed of a layer deposited on the upper surface of the drift layer 120, into which the n-type source/drain regions 940 are implanted.

A trench 950 may be formed in the drift layer 120. In some embodiments, a bottom surface of the trench 950 may extend below a bottom surface of the p-wells 930 and/or the source/drain regions 940 into the drift layer 120. A gate insulating layer may be formed on the upper surface of the semiconductor layer structure 250 as well as the sidewalls and bottom surface of the trench 950. A gate electrode layer may be formed on the gate insulating layer. The gate insulating layer and the gate electrode layer may be patterned and etched to form gate insulating pattern 970 and gate electrode 972. The gate insulating pattern 970 and gate electrode 972 may be formed within the trench 950 in the drift layer 120 between the p-wells 930 and n-type source/drain regions 940 and, in some embodiments, may extend onto the surface of the drift layer 120. In some embodiments, an upper surface of the gate insulating pattern 970 and gate electrode 972 may be coplanar with an upper surface of the semiconductor layer structure 250.

As can be seen from FIG. 9A, a difference between the UMOSFET device 900 and the previously described MOSFET device 200 is that the UMOSFET device 900 includes gate trenches 950. Instead of having a planar gate insulating pattern, a U-shaped gate insulating pattern 970 is formed within the gate trench 950. A respective gate electrode 972 then fills the remainder of each gate trench 950. Since the gate electrode 972 penetrates into the upper surface of the semiconductor layer structure 250, the device channels are now vertical channel that extend through the portion of the p-wells 930 that are underneath the n-type source/drain regions 940. The p-type shield regions 915 may protect portions of the gate insulating pattern 970 that are adjacent the corners of the gate trenches 950 from high electric fields that may degrade the gate insulating pattern 970. As with the MOSFET device 200 of FIG. 2A, the UMOSFET device 900 may have a JFET region below the gate electrode 972.

Figure 9B:
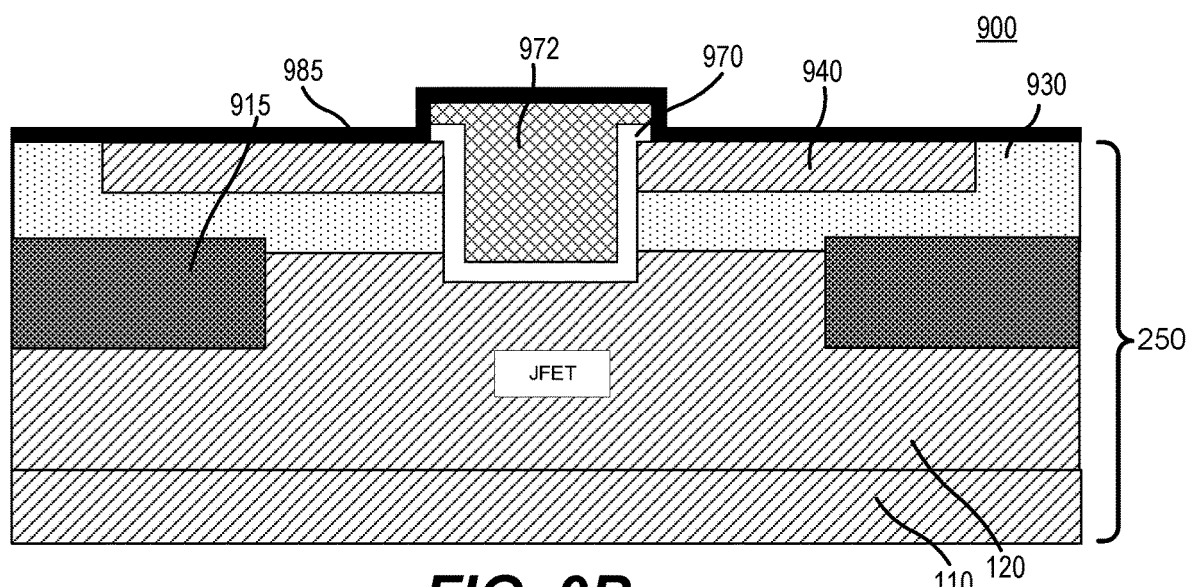

Referring to FIG. 9B, interface material 985 may be formed on the gate insulating pattern 970 and gate electrode 972. In some embodiments, the interface material 985 may include H, N, B, P, La, Sr, and/or Ba or compounds containing these elements. The interface material 985 may include an interface control and/or interface passivating material. The interface material 985 can be applied or deposited as an element, as an oxide, as a silicate, and/or as a carbonate compound. In some embodiments, the interface material 985 can be applied by an anneal in a gaseous state. An interface passivation agent of the interface material 985 may enhance oxidation, leaving a slightly thicker gate insulating pattern 970 under edges of the gate electrode 972. Passivation elements of the interface material 985 may be that of a single element, or multiple passivation elements may be present. The interface material 985 may be applied in a single step, or applied through multiple processing steps. The interface material 985 may be disposed on, for example, a top surface of the gate electrode 972, sidewalls of the gate electrode 972, sidewalls of the gate insulating pattern 970, and a top surface of the semiconductor layer structure 250.

Figure 9C:
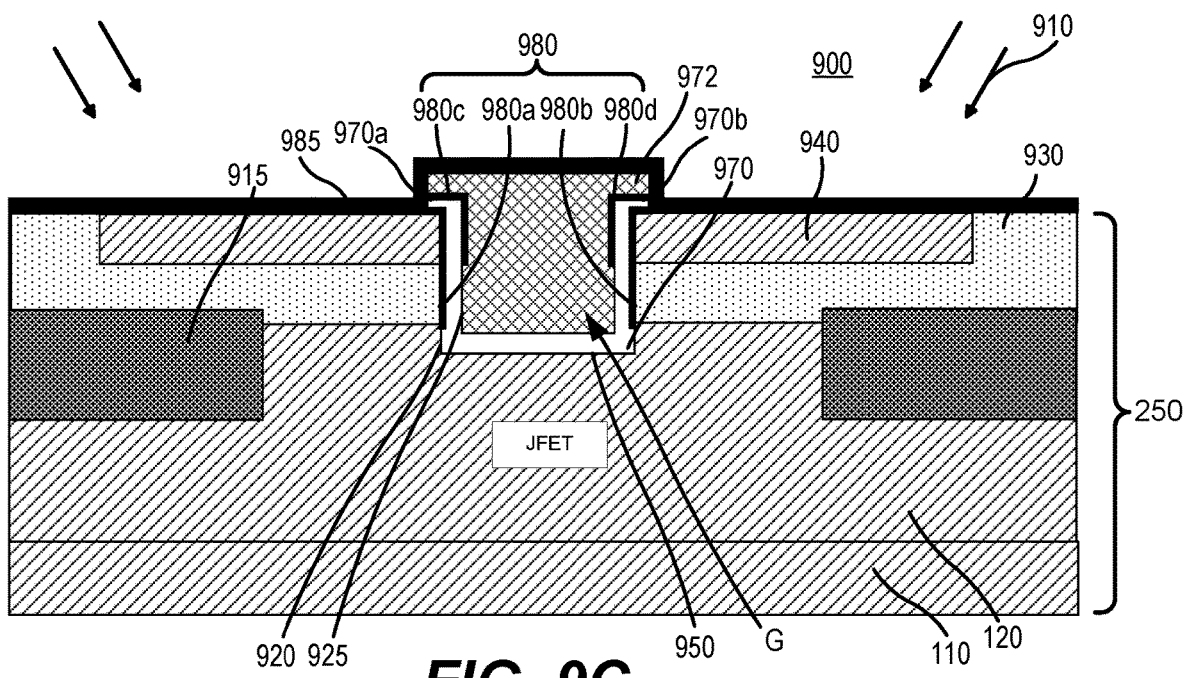

Referring to FIG. 9C, an anneal operation 910 is performed. The anneal may be performed, for example, at a temperature of between 400° C. and 1300° C. The temperature used for the anneal process may depend on the materials used for the interface material 985. The anneal may be performed, for example, in an inert environment or an oxidizing environment. As a result of the anneal operation 910, portions of the interface material 985 may diffuse into the interface 920 between the gate insulating pattern 970 and semiconductor layer structure 250 from the edges of the gate insulating pattern 970. The portions of the interface material 985 that diffuse into the interface 920 may form interface layer 980.

FIG. 9C illustrates that, in some embodiments, the interface material 985 may also diffuse into the interface 925 between the gate electrode 972 and the gate insulating pattern 970. Therefore, in some embodiments, third segment 980c and fourth segment 980d of the interface layer 980 may also be formed between the gate electrode 972 and the gate insulating pattern 970. In some embodiments, the third segment 980c and fourth segment 980d of the interface layer 980 may be omitted.

The interface layer 980 may include a plurality of segments. For example, the interface layer 980 may include a first segment 980a adjacent a first edge of the gate electrode 972 and/or gate insulating pattern 970 and a second segment 980b adjacent a second edge of the gate electrode 972 and/or gate insulating pattern 970.

In some embodiments, the first segment 980a of the interface layer 980 may extend from a first edge 970a of the gate insulating pattern 970 along the gate insulating pattern 970 and a sidewall of the gate trench 950. At least a portion of the first segment 980a may be disposed between the gate insulating pattern 970 and the semiconductor layer structure 250 in a direction (e.g., a horizontal direction) that is parallel to the upper surface of the semiconductor layer structure 250. In some embodiments, the first segment 980a may extend between the gate insulating pattern 970 and a portion of the source/drain region 940, a portion of a p-well 930, and/or a portion of the drift layer 120. In some embodiments, the first segment 980a may extend over a portion of the JFET region, but may not extend between at least a portion of the interface between the JFET region and the gate insulating pattern 970.

In some embodiments, the second segment 980b of the interface layer 980 may extend from a second edge 970b of the gate insulating pattern 970 along the gate insulating pattern 970 and a sidewall of the gate trench 950. At least a portion of the second segment 980b may be disposed between the gate insulating pattern 970 and the semiconductor layer structure 250 in the direction (e.g., the horizontal direction) that is parallel to the upper surface of the semiconductor layer structure 250. In some embodiments, the second segment 980b may extend between the gate insulating pattern 970 and a portion of the source/drain region 940, a portion of a p-well 930, and/or a portion of the drift layer 120. In some embodiments, the second segment 980b may extend over a portion of the JFET region, but may not extend between at least a portion of the interface between the JFET region and the gate insulating pattern 970.

In some embodiments, a doping concentration of the first segment 980a and/or the second segment 980b of the interface layer 980 may vary along a length thereof. For example, a doping concentration of the first segment 980a may be highest near the first edge 970a of the gate insulating pattern 970 and may decrease as the first segment 980a extends along the sidewall of the trench 950, though the embodiments described herein are not limited thereto. The change in the doping concentration of the first segment 980a as the first segment 980a extends along the sidewall of the trench 950 can be linear, exponential, step, random, etc., as it goes from highest doping concentration to a lowest doping concentration (e.g., from an upper portion of the trench 950 to a lower portion of the trench 950). The doping concentration of the second segment 980b may be similar to that of the first segment 980a, but the embodiments described herein are not limited thereto. In some embodiments, the second segment 980b may have a different distribution of dopant concentration than the first segment 980a.

The interface layer 980 may include a center portion with edge portions on either side of the center portion. The center portion of the interface layer 980 may be adjacent the bottom of the trench 950 and the edge portions of the interface layer 980 may be near the sidewalls 970a, 970b of the gate insulating pattern 970. The first segment 980a and the second segment 980b may be in the edge portions and may extend towards the center portion.

At least a portion of the upper surface of the semiconductor layer structure 250 beneath the gate insulating pattern 970 on the bottom of the trench 950 (e.g., a portion over the JFET region of the semiconductor layer structure 250) may be free of the interface layer 980. For example a gap G may be formed between the first segment 980a and the second segment 980b. Thus, a portion of the interface between the gate insulating pattern 970 and the JFET region of the semiconductor layer structure 250 may not have the interface layer 980 therebetween.

In some embodiments, portions of the interface layer 980 may be present between the first segment 980a and the second segment 980b, although such portions may have a lower dopant concentration and/or thickness than the first segment 980a and the second segment 980b. For example, in some embodiments, the first segment 980a may extend to meet the second segment 980b, with the portion of the interface layer 980 over the JFET region (e.g., adjacent the center portion of the interface layer 980) having a lowest dopant concentration of the interface layer 980. Thus, portions of the interface layer may meet over the JFET region but may have a structure similar to that illustrated in FIG. 2C.

Figure 9D:
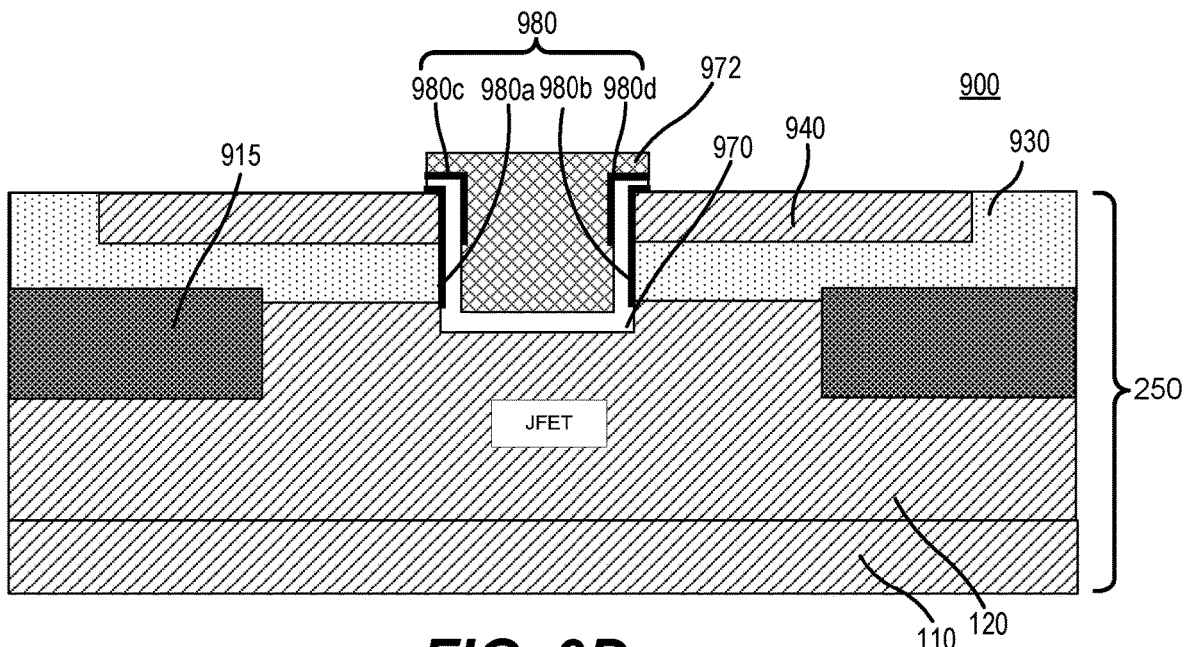

Referring to FIG. 9D, after the anneal operation 910 is complete, the exposed interface material 985 may be removed from the device (e.g., by etching) to leave the UMOSFET device 900.

FIGS. 10A to 10D illustrate an embodiment of a method of manufacturing a semiconductor device according to embodiments described herein. A description of those elements of FIGS. 10A to 10D that are the same or similar to those previously discussed will be omitted for brevity. Accordingly, the description of FIGS. 10A to 10D will focus on differences from what has been previously described.

Figure 10A:
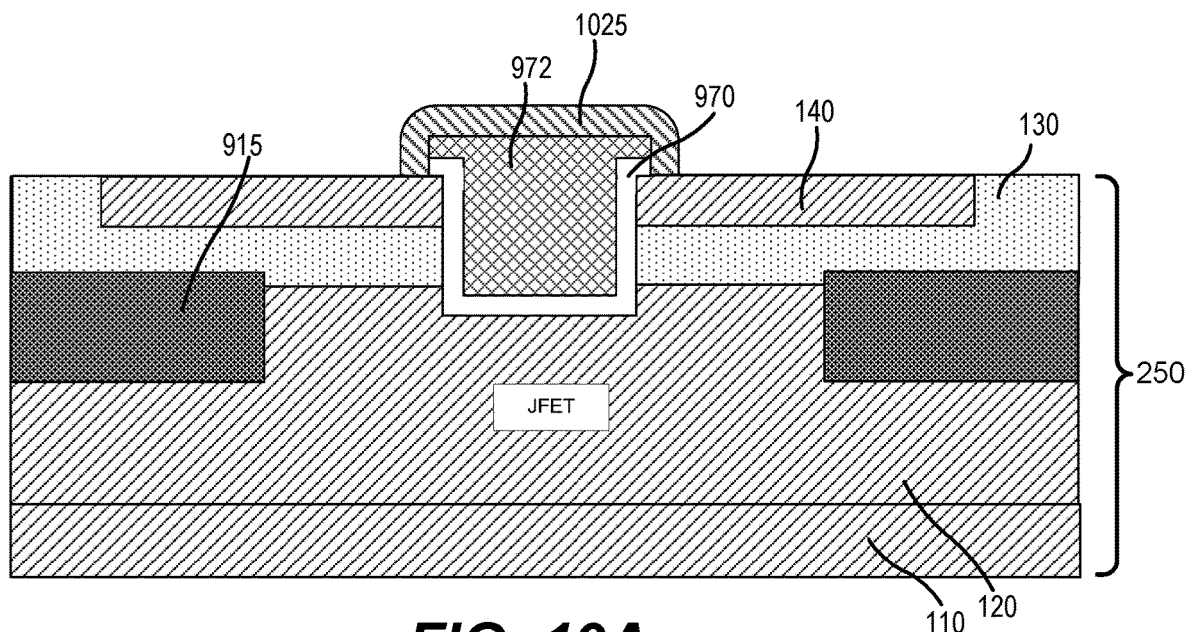

Referring to FIG. 10A, a semiconductor layer structure 250 similar to that of FIG. 9A may be formed. A protective dielectric barrier 1025 (for example, $SiO_2$, SiON, $Si_xN_y$, $Al_2O_3$, etc.) may be formed on the gate insulating pattern 970 and the gate electrode 972. The protective dielectric barrier 1025 may be formed, for example, by depositing a dielectric layer on the gate insulating pattern 970 and the gate electrode 972, and then patterning/etching the dielectric layer to form the protective dielectric barrier 1025. In some embodiments, the protective dielectric barrier 1025 may be thermally grown. The protective dielectric barrier 1025 may be formed so as to have a sidewall adjacent a sidewall of the gate insulating pattern 970. In some embodiments, an interface between the protective dielectric barrier 1025 and the semiconductor layer structure 250 may be substantially coplanar with an interface between gate insulating pattern 970 and the semiconductor layer structure 250.

Figure 10B:
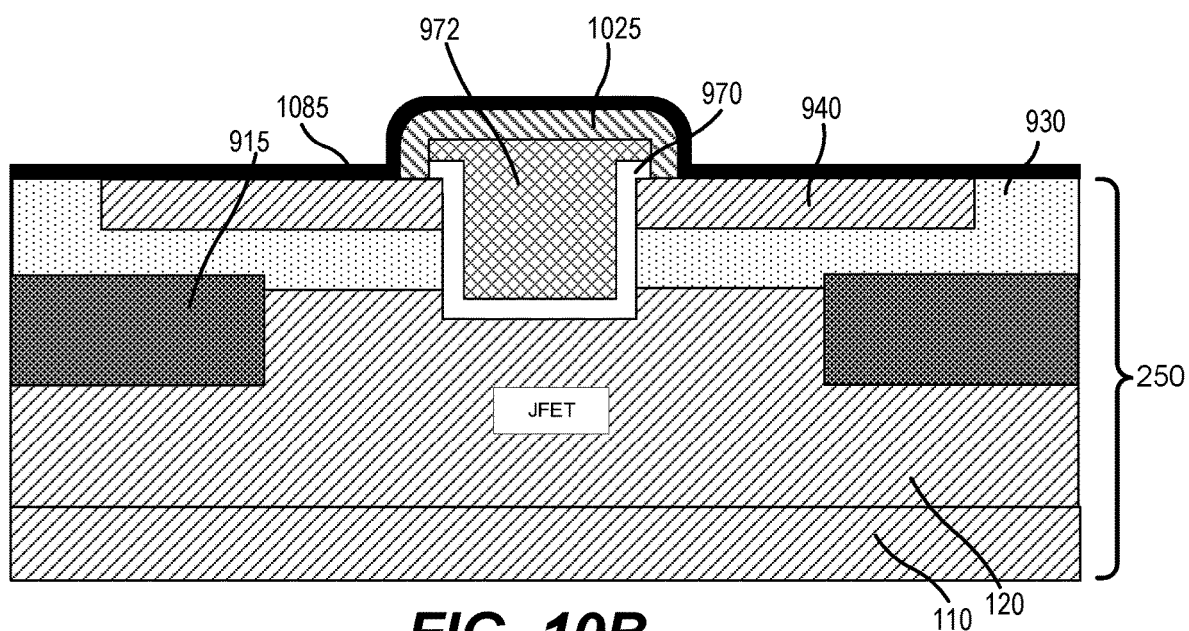

Referring to FIG. 10B, interface material 1085 may be formed on the protective dielectric barrier 1025 and the top surface of the semiconductor layer structure 250. In some embodiments, the interface material 1085 may include H, N, B, P, La, Sr, and/or Ba or compounds containing these elements. The interface material 1085 may include an interface control and/or interface passivating material. The interface material 1085 can be applied or deposited as an element, as an oxide, as a silicate, and/or as a carbonate compound. In some embodiments, the interface material 1085 can be applied by an anneal in a gaseous state. An interface passivation agent of the interface material 1085 may enhance oxidation, leaving a slightly thicker gate insulating pattern 970 under edges of the gate electrode 972. Passivation elements of the interface material 1085 may be that of a single element, or multiple passivation elements may be present. The interface material 1085 may be applied in a single step, or applied through multiple processing steps. The interface material 1085 may be disposed on, for example, a top surface and sidewalls of the protective dielectric barrier 1025 and a top surface of the semiconductor layer structure 250.

Figure 10C:
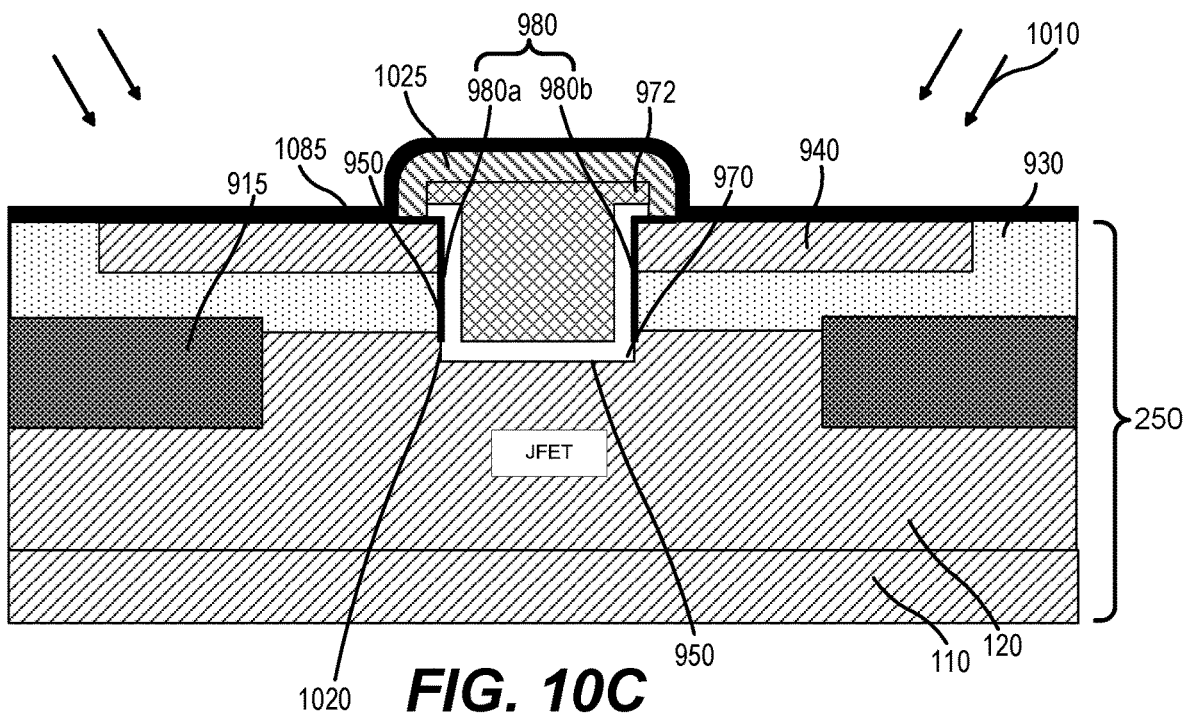

Referring to FIG. 10C, an anneal operation 1010 is performed. As a result of the anneal operation 1010, portions of the interface material 1085 may diffuse into the interface 1020 between the gate insulating pattern 970 and semiconductor layer structure 250 from the edges of the gate insulating pattern 970 and edges of the protective dielectric barrier 1025. The portions of the interface material 1085 that diffuse into the interface 520 may form interface layer 980. A duration of the anneal operation 1010 may be controlled so as to allow enough diffusion to extend the interface layer 980 from the edges of the gate insulating pattern 970 and edges of the protective dielectric barrier 1025 along sidewalls of the trench 950 without extending over the center of the JFET region. In some embodiments, the protective dielectric barrier 1025 may protect surfaces of the gate electrode 972 during the anneal operation 1010. The interface layer 980 may include the first segment 980a and the second segment 980b.

Figure 10D:
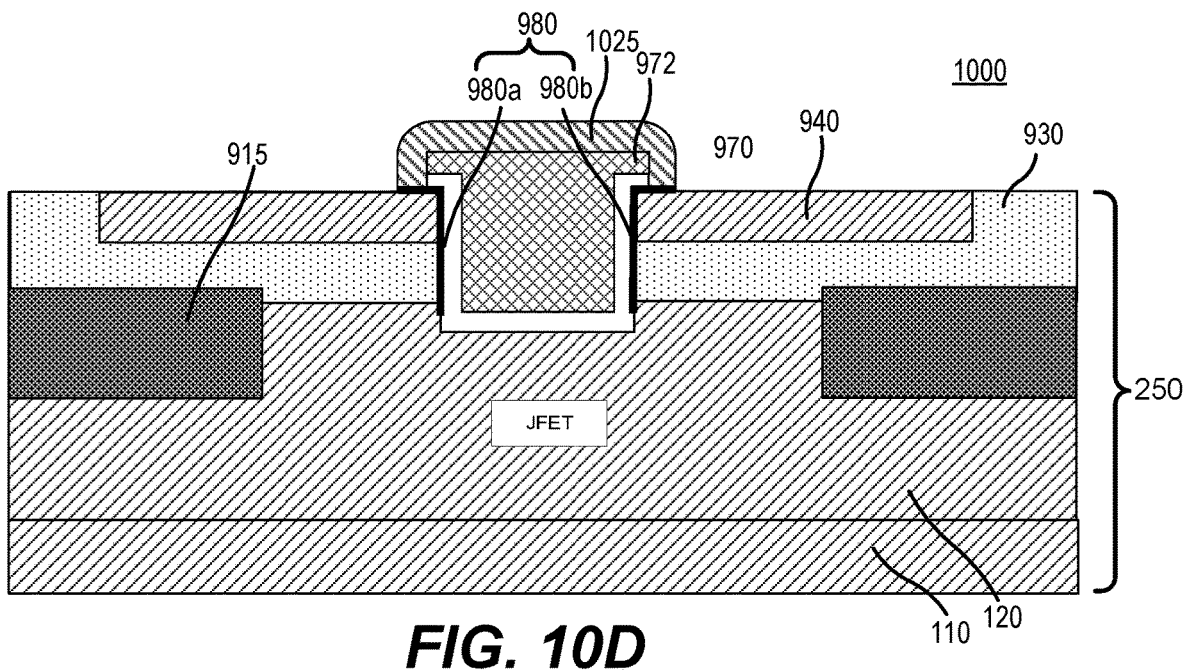

Referring to FIG. 10D, after the anneal operation 1010 is complete, the excess interface material 1085 may be removed from the protective dielectric barrier 1025 and/or the top surface of the semiconductor layer structure 250 (e.g., by etching) to form device 1000. In some embodiments, the protective dielectric barrier 1025 may remain in the final semiconductor device 1000. In some embodiments, the protective dielectric barrier 1025 may be removed after the interface layer 980 is formed. The method used to create device 1000 illustrated in FIGS. 10A-10D may avoid disposing elements of the interface layer 980 between the gate insulating pattern 970 and the gate electrode 972 (e.g., the third segment 980c and fourth segment 980d of FIG. 9D).

FIGS. 11A to 11D illustrate an embodiment of a method of manufacturing semiconductor devices according to embodiments described herein. A description of those elements of FIGS. 11A to 11D that are the same or similar to those previously discussed will be omitted for brevity. Accordingly, the description of FIGS. 11A to 11D will focus on differences from what has been previously described.

Figure 11A:
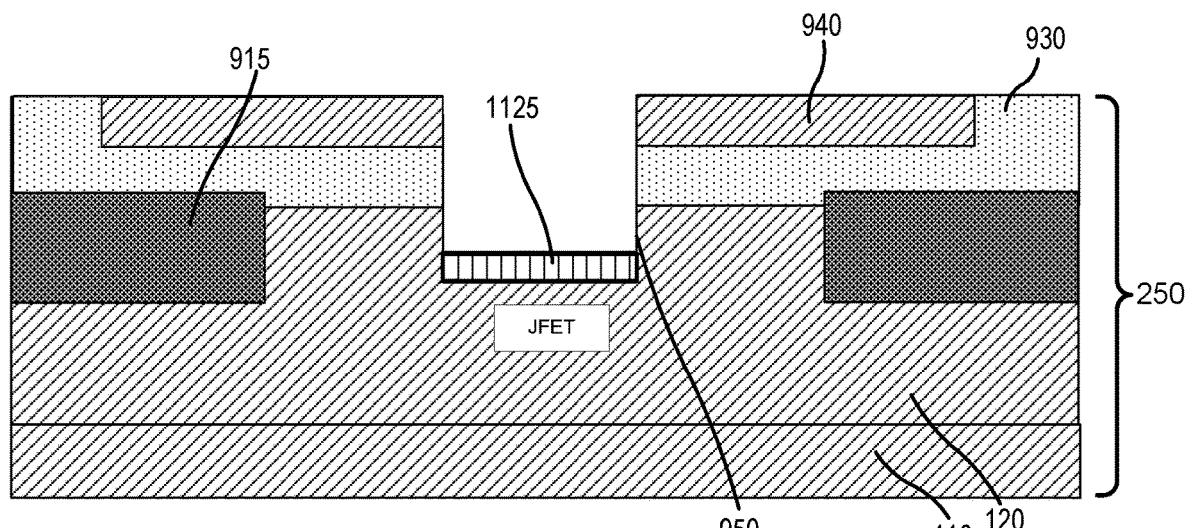

Referring to FIG. 11A, a semiconductor layer structure 250 similar to that of FIG. 9A may be formed. For example, a lightly-doped n-type (n−) silicon carbide drift layer 120 may be provided on the substrate 110. P-type shield regions 915 may be formed in the drift layer 120. P-wells 930 may be formed on the p-type shield regions 915 and n-type source/drain regions 940 may be formed in the p-wells 930. A gate trench 950 may be formed in the drift layer 120, and a dielectric pattern 1125 may be formed on a bottom of the gate trench 950. The dielectric pattern 1125 may be formed, for example, by depositing or thermally growing a dielectric layer on the semiconductor layer structure 250 and on a bottom surface of the trench 950. The dielectric layer may then be etched back to leave the dielectric pattern 1125. The dielectric pattern 1125 may also be referred to herein as a blocking pattern.

Figure 11B:
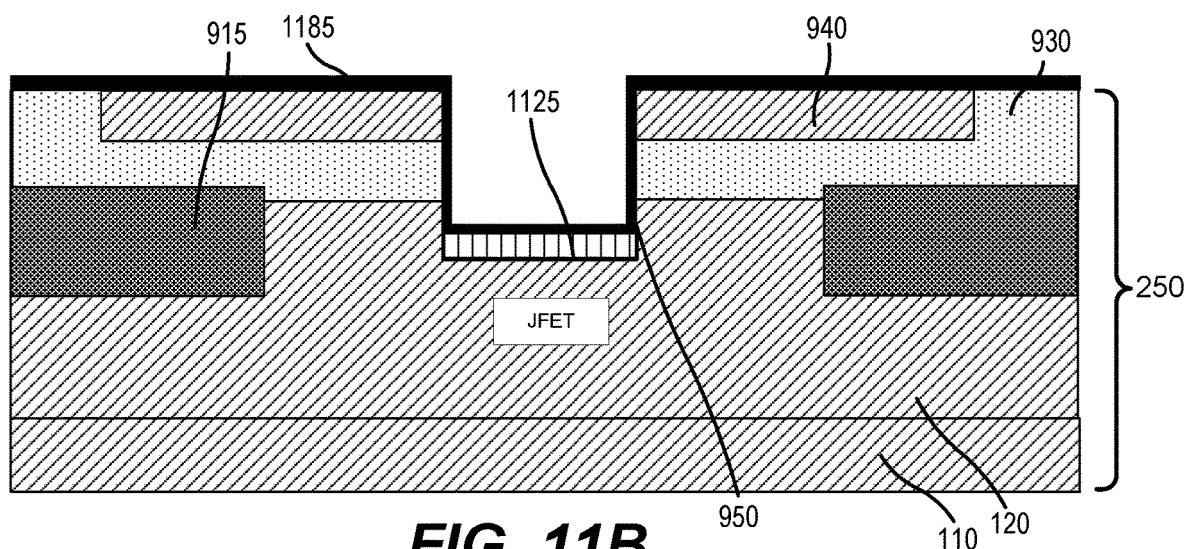

Referring to FIG. 11B, interface material 1185 may be deposited on the semiconductor layer structure 250, sidewalls of the trench 950, and an upper surface of the dielectric pattern 1125. In some embodiments, the interface material 1185 may include H, N, B, P, La, Sr, and/or Ba or compounds containing these elements. The interface material 1185 may include an interface control and/or interface passivating material. The interface material 1185 can be applied or deposited as an element, as an oxide, as a silicate, and/or as a carbonate compound. In some embodiments, the interface material 1185 can be applied by an anneal in a gaseous state. Passivation elements of the interface material 1185 may be that of a single element, or multiple passivation elements may be present. The interface material 1185 may be applied in a single step, or applied through multiple processing steps.

Figure 11C:
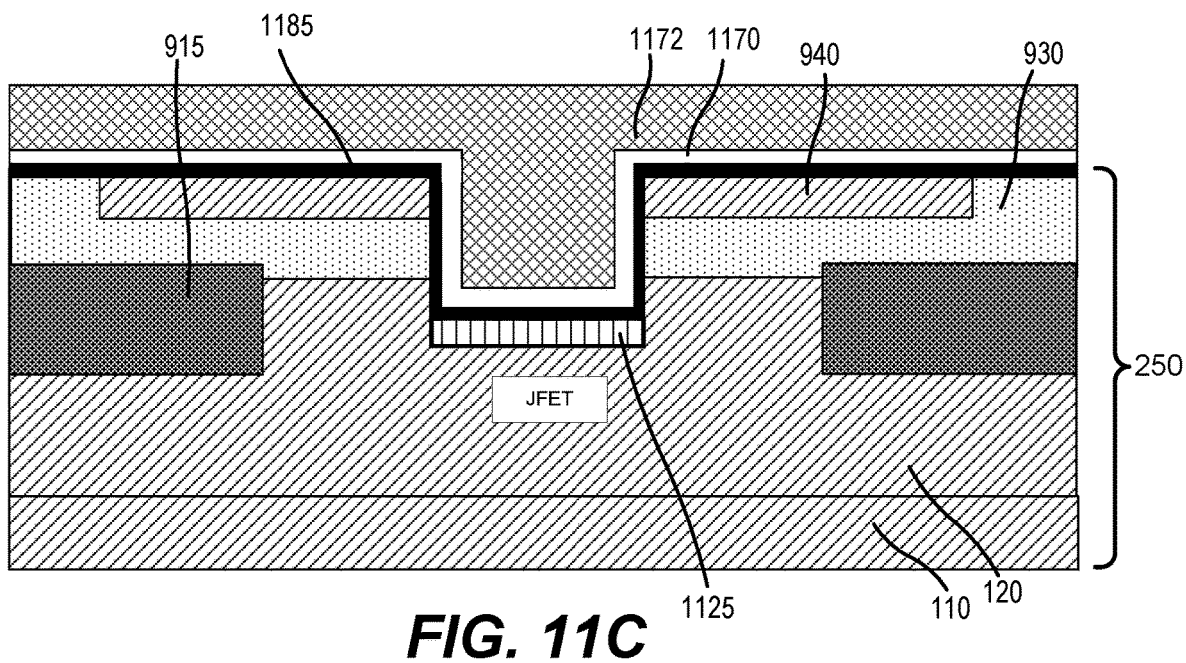

Referring to FIG. 11C, a gate insulating layer 1170 may be formed on the upper surface of the interface material 1185. A gate electrode layer 1172 may be formed on the gate insulating layer 1170.

Figure 11D:
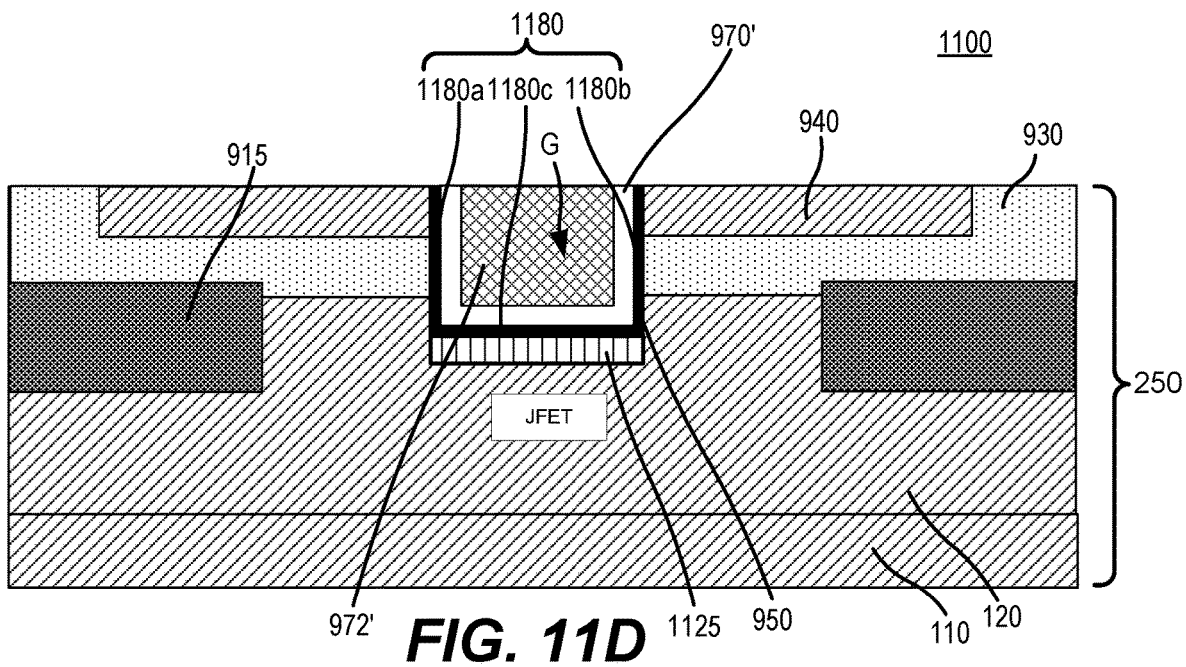

Referring to FIG. 11D, the gate insulating layer 1170, the gate electrode layer 1172, and the interface material 1185 may be patterned and etched to form gate insulating pattern 970', gate electrode 972', and the interface layer 1180 so as to form semiconductor device 1100. For example, the gate insulating layer 1170, the gate electrode layer 1172, and the interface material 1185 may be planarized to remove portions of the gate insulating layer 1170, the gate electrode layer 1172, and the interface material 1185 that are above an upper surface of the semiconductor layer structure 250. Though the gate electrode 972' and the gate insulating pattern 970' are illustrated as having an upper surface that is coplanar with the upper surface of the semiconductor layer structure 250, the embodiments described herein are not limited thereto. In some embodiments, for example, the gate insulating layer 1170, the gate electrode layer 1172, and the interface material 1185 may be patterned to form a gate structure having portions of the gate electrode 972' and the gate insulating pattern 970' that are above the upper surface of the semiconductor layer structure 250 (e.g., a T-gate structure).

Semiconductor device 1100 of FIG. 11D differs from the semiconductor device 900 of FIG. 9D in that it contains the dielectric pattern 1125 over the central portion of the JFET region of the semiconductor layer structure 250.

As illustrated in FIG. 11D, the interface layer 1180 may include a plurality of segments. For example, the interface layer 1180 may include a first segment 1180a on a first sidewall of the gate trench 950, a second segment 1180b on a second sidewall of the gate trench 950, and a third segment 1180c on an upper surface of the dielectric pattern 1125. A gap G may be present between the first segment 1180a and the second segment 1180b. In some embodiments, the first segment 1180a may be coupled to the second segment 1180b by the third segment 1180c (e.g., the first segment 1180a, the second segment 1180b, and the third segment 1180c may be contiguous). In some embodiments, the third segment 1180c may extend over the JFET region, but the dielectric pattern 1125 may be disposed between the third segment 1180c and the JFET region. Thus, at least a portion of the upper surface of the semiconductor layer structure 250 over the center of the JFET region may be free of the interface layer 1180. The dielectric pattern 1125 may serve to protect the JFET region from degradation caused by the interface layer 1180.

FIGS. 12A to 12D illustrate an embodiment of a method of manufacturing semiconductor devices according to embodiments described herein. A description of those elements of FIGS. 12A to 12D that are the same or similar to those previously discussed will be omitted for brevity. Accordingly, the description of FIGS. 12A to 12D will focus on differences from what has been previously described.

Figure 12A:
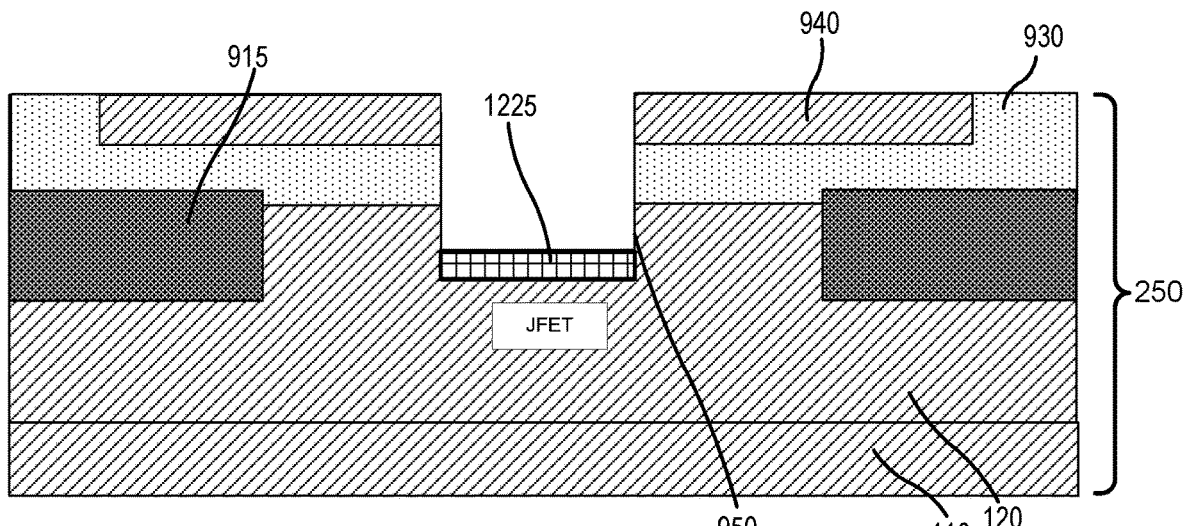

Referring to FIG. 12A, a semiconductor layer structure 250 similar to that of FIG. 11A may be formed. For example, a lightly-doped n-type (n−) silicon carbide drift layer 120 may be provided on the substrate 110. P-type shield regions 915 may be formed in the drift layer 120. P-wells 930 may be formed on the p-type shield regions 915 and n-type source/drain regions 940 may be formed in the p-wells 930. A gate trench 950 may be formed in the drift layer 120, and a mask pattern 1225 may be formed on a bottom of the gate trench 950. The mask pattern 1225 may be formed, for example, by depositing or thermally growing a mask layer on the semiconductor layer structure 250 and on a bottom surface of the trench 950, and then etching the dielectric layer to leave the mask pattern 1225. In some embodiments, the mask pattern 1225 may be a photoresist, dielectric, and/or other appropriate masking material. The mask pattern 1225 may also be referred to herein as a blocking pattern.

Figure 12B:
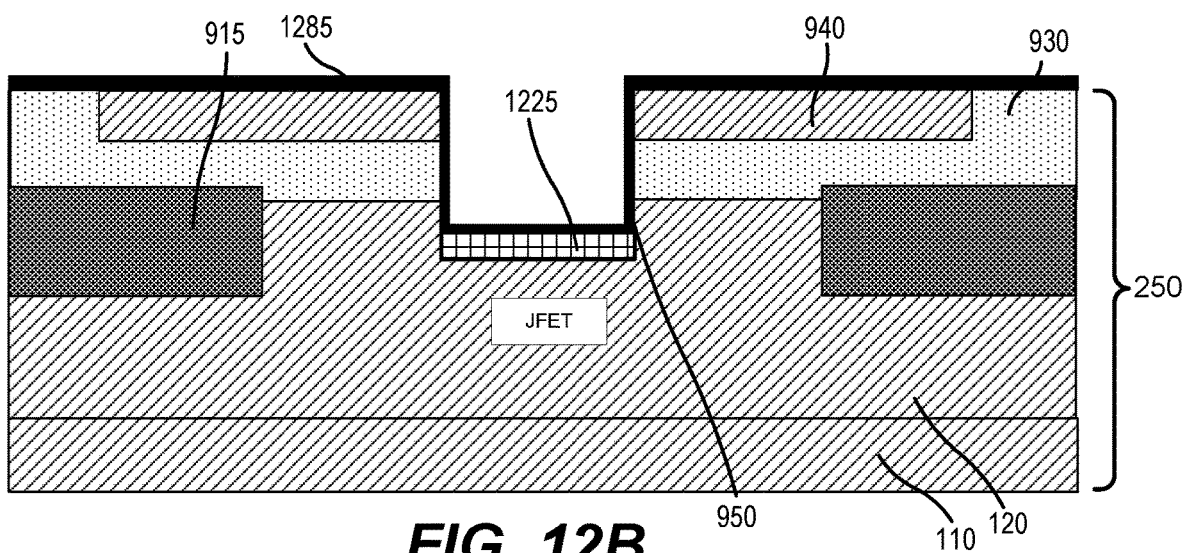

Referring to FIG. 12B, interface material 1285 may be deposited on the semiconductor layer structure 250, sidewalls of the trench 950, and an upper surface of the mask pattern 1225. In some embodiments, the interface material 1285 may include H, N, B, P, La, Sr, and/or Ba or compounds containing these elements. The interface material 1285 may include an interface control and/or interface passivating material. The interface material 1285 can be applied or deposited as an element, as an oxide, as a silicate, and/or as a carbonate compound. In some embodiments, the interface material 1285 can be applied by an anneal in a gaseous state. Passivation elements of the interface material 1285 may be that of a single element, or multiple passivation elements may be present. The interface material 1285 may be applied in a single step, or applied through multiple processing steps.

Figure 12C:
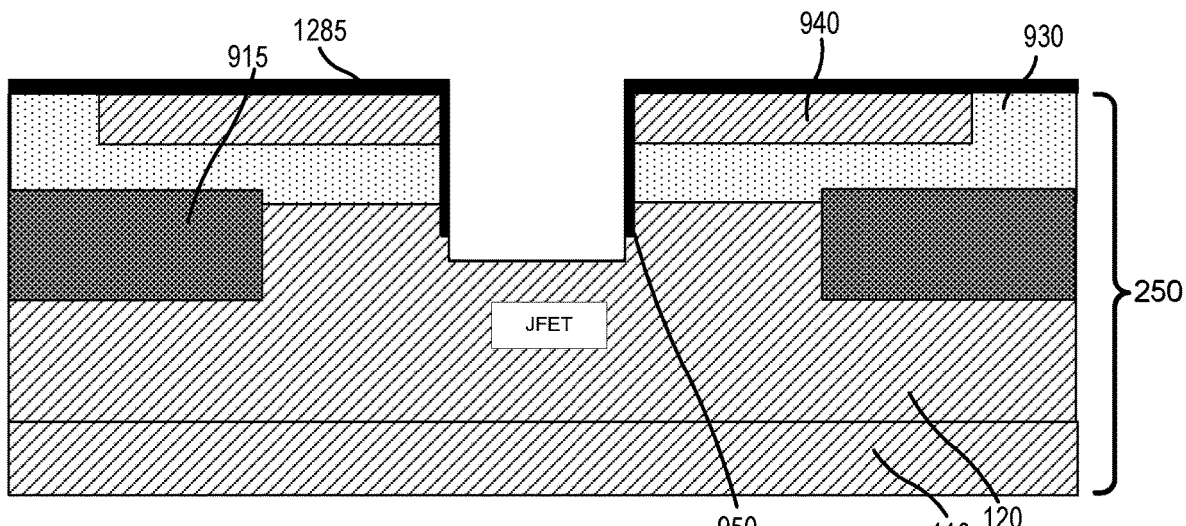

Referring to FIG. 12C, the mask pattern 1225 and the interface material 1285 on the mask pattern 1225 may be removed. For example, an etch process may be utilized to remove the mask pattern 1225 and that portion of the interface material 1285 that is on a bottom surface of the trench 950, though the embodiments described herein are not limited thereto. In some embodiments, a lift-off process may be used to remove the mask pattern 1225 along with the bottom portion of the interface material 1285.

Figure 12D:
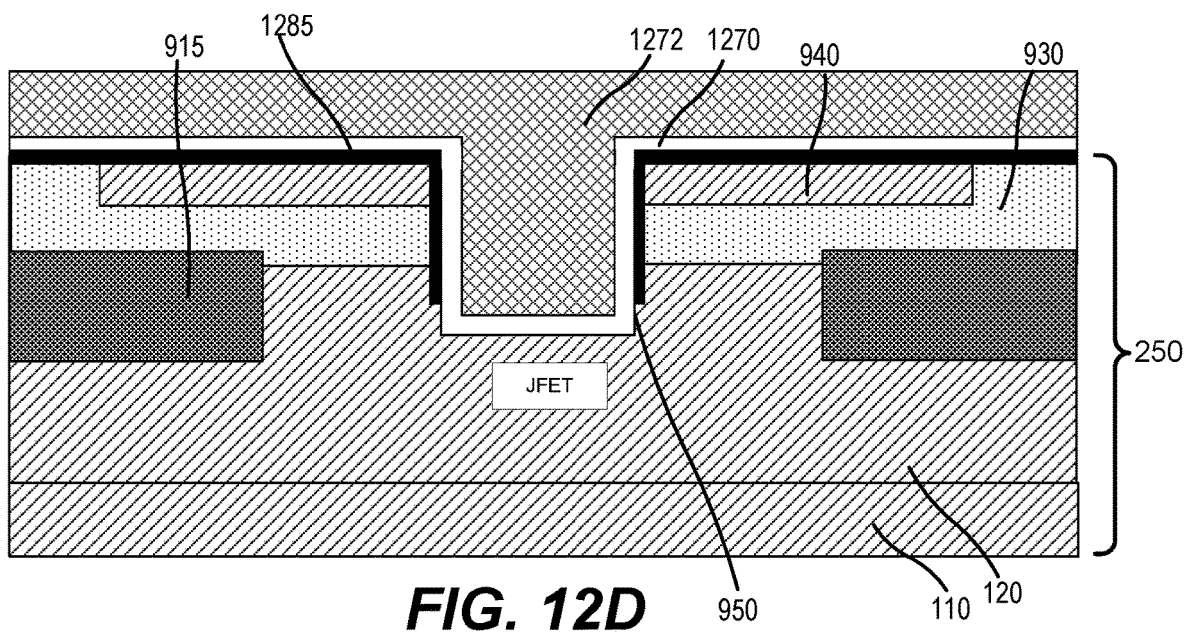

Referring to FIG. 12D, a gate insulating layer 1270 may be formed on the upper surface of the interface material 1285 and in the trench 950. The gate insulating layer 1270 may be formed on the bottom surface of the trench 950 that was exposed by the removal of the mask pattern 1225. A gate electrode layer 1272 may be formed on the gate insulating layer 1270.

Figure 12E:
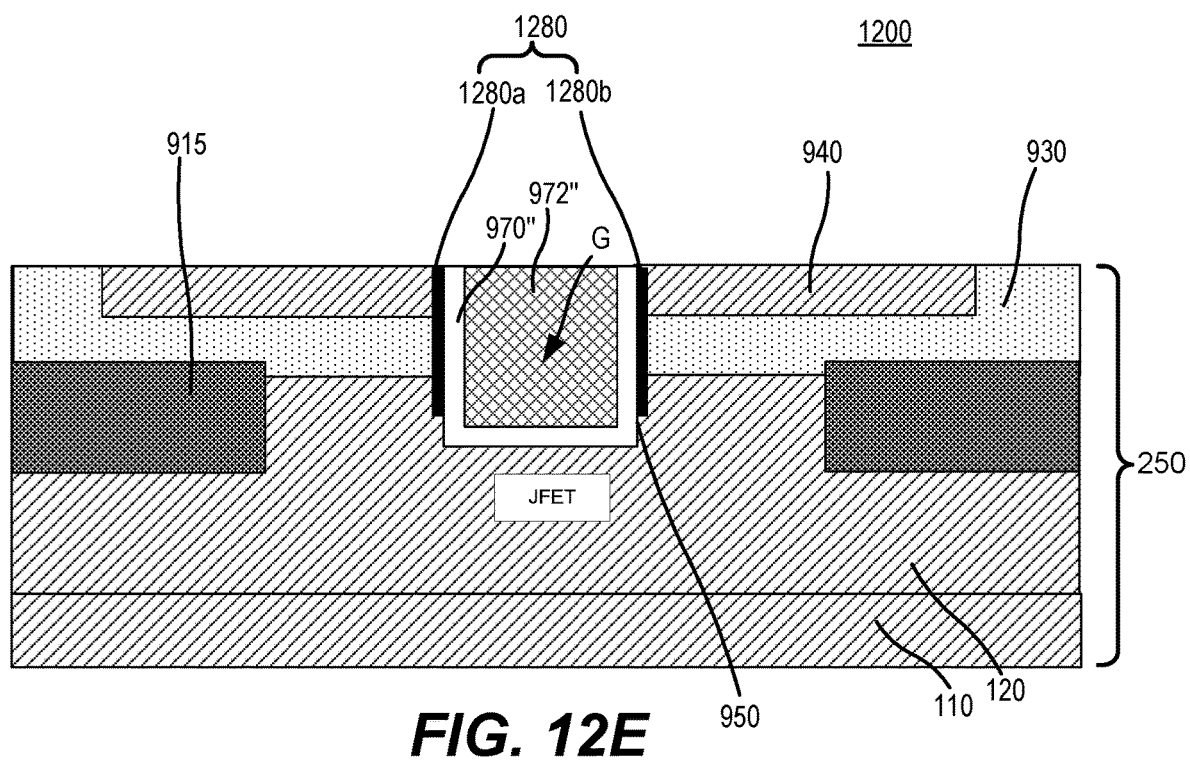

Referring to FIG. 12E, the gate insulating layer 1270, the gate electrode layer 1272, and the interface material 1285 may be patterned and etched to form gate insulating pattern 970", gate electrode 972", and the interface layer 1280 so as to form semiconductor device 1200. For example, the gate insulating layer 1270, the gate electrode layer 1272, and the interface material 1285 may be planarized to remove portions of the gate insulating layer 1270, the gate electrode layer 1272, and the interface material 1285 that are above an upper surface of the semiconductor layer structure 250. Though the gate electrode 972" and the gate insulating pattern 970" are illustrated as having an upper surface that is coplanar with the upper surface of the semiconductor layer structure 250, the embodiments described herein are not limited thereto. In some embodiments, for example, the gate insulating layer 1270, the gate electrode layer 1272, and the interface material 1285 may be patterned to form a gate structure having portions of the gate electrode 972" and the gate insulating pattern 970" that are above the upper surface of the semiconductor layer structure 250 (e.g., a T-gate structure).

The interface layer 1280 may include a plurality of segments. For example, the interface layer 1280 may include a first segment 1280a on a first sidewall of the gate trench 950 and a second segment 1280b on a second sidewall of the gate trench 950. In some embodiments, the floor of the gate trench 950 may be free of the interface layer 1280. In some embodiments, a gap G is between the first segment 1280a and the second segment 1280b.

In some embodiments, the first segment 1280a of the interface layer 1280 may extend along the gate insulating pattern 970" and a sidewall of the gate trench 950. At least a portion of the first segment 1280a may be disposed between the gate insulating pattern 970" and the semiconductor layer structure 250 in a direction (e.g., a horizontal direction) that is parallel to the upper surface of the semiconductor layer structure 250. In some embodiments, the first segment 1280a may extend between the gate insulating pattern 970" and a portion of the source/drain region 940, a portion of a p-well 930, and/or a portion of the drift layer 120. In some embodiments, the first segment 1280a may not extend between at least a portion of the interface between the JFET region and the gate insulating pattern 970".

In some embodiments, the second segment 1280b of the interface layer 1280 may extend along the gate insulating pattern 970" and a sidewall of the gate trench 950. At least a portion of the second segment 1280b may be disposed between the gate insulating pattern 970" and the semiconductor layer structure 250 in a direction (e.g., a horizontal direction) that is parallel to the upper surface of the semiconductor layer structure 250. In some embodiments, the second segment 1280b may extend between the gate insulating pattern 970" and a portion of the source/drain region 940, a portion of a p-well 930, and/or a portion of the drift layer 120. In some embodiments, the second segment 1280b may not extend between at least a portion of the interface between the JFET region and the gate insulating pattern 970".

While FIGS. 2A-12E each illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device comprising:
a semiconductor layer structure;
a gate insulator on the semiconductor layer structure;
a gate electrode on the gate insulator; and
an interface layer between the gate insulator and the semiconductor layer structure, the interface layer having a first segment and a second segment with a gap therebetween,
wherein the interface layer comprises hydrogen (H), nitrogen (N), boron (B), phosphorous (P), lanthanum (La), strontium (Sr), and/or barium (Ba).

2. The semiconductor device of claim 1, wherein the first segment of the interface layer extends from an edge of the gate insulator in a direction towards a center portion of the gate insulator.

3. The semiconductor device of claim 2, wherein a dopant concentration of a portion of the first segment of the interface layer decreases as the first segment extends towards the center portion of the gate insulator.

4. The semiconductor device of claim 2, wherein a thickness of the gate insulator is greater near the edge of the gate insulator than in the center portion of the gate insulator.

5. The semiconductor device of claim 1, wherein the first segment and the second segment of the interface layer are substantially coplanar.

6. The semiconductor device of claim 1, wherein the interface layer further comprises a third segment that is farther from a top surface of the semiconductor layer structure than the first segment or the second segment.

7. The semiconductor device of claim 6, further comprising a dielectric pattern between the top surface of the semiconductor layer structure and the third segment of the interface layer.

8. The semiconductor device of claim 1, wherein a portion of the gate electrode extends below a top surface of the semiconductor layer structure.

9. A semiconductor device comprising:
a semiconductor layer structure;
a gate insulator on the semiconductor layer structure;
a gate electrode on the gate insulator; and
an interface layer between the gate insulator and the semiconductor layer structure, the interface layer having a first segment and a second segment with a gap therebetween,
wherein the semiconductor layer structure comprises a first source/drain region, a second source/drain region, and a junction field effect transistor (JFET) region between the first source/drain region and the second source/drain region.

10. The semiconductor device of claim 9, wherein the gap is over at least a portion of the JFET region.

11. The semiconductor device of claim 9,
wherein the first segment is between the first source/drain region and the gate insulator,
wherein the second segment is between the second source/drain region and the gate insulator, and
wherein an upper surface of the semiconductor layer structure between at least a portion of the JFET region and the gate insulator is free of the interface layer.

12. The semiconductor device of claim 11, wherein the first segment of the interface layer extends towards the JFET region from a first position over the first source/drain region to a second position beyond the first source/drain region that is between the gate insulator and the upper surface of the semiconductor layer structure.

13. The semiconductor device of claim 12, wherein a dopant concentration of the first segment of the interface layer decreases as the first segment extends towards the second position.

14. The semiconductor device of claim 9, wherein the interface layer further comprises a third segment on the JFET region that is farther from a top surface of the semiconductor layer structure than the first segment or the second segment.

15. The semiconductor device of claim 14, further comprising a dielectric pattern between the JFET region and the third segment of the interface layer.

16. A semiconductor device comprising:
a semiconductor layer structure;
a gate insulator on the semiconductor layer structure;
a gate electrode on the gate insulator; and
an interface layer between the gate insulator and the semiconductor layer structure, the interface layer having first and second edge portions on opposite sides of a center portion,
wherein a dopant concentration of the interface layer decreases from the first edge portion to the center portion.

17. The semiconductor device of claim 16, wherein a first segment of the interface layer extends from the first edge portion of the interface layer in a direction towards the center portion of the interface layer.

18. The semiconductor device of claim 16, wherein a change in the dopant concentration of the interface layer from the first edge portion to the center portion is linear, exponential, step, and/or random.

19. The semiconductor device of claim 16, wherein the interface layer comprises a first segment in the first edge portion of the interface layer and a second segment in the second edge portion of the interface layer,
wherein the semiconductor layer structure comprises a first source/drain region, a second source/drain region, and a junction field effect transistor (JFET) region between the first source/drain region and the second source/drain region, and
wherein the semiconductor device further comprises a gap between the first segment and the second segment of the interface layer that is over at least a portion of the JFET region.

20. The semiconductor device of claim 16, wherein a portion of the gate electrode extends below a top surface of the semiconductor layer structure.

21. The semiconductor device of claim 16, wherein the interface layer is also present between the gate electrode and the gate insulator.

22. The semiconductor device of claim 16, wherein a thickness of the gate insulator is greater adjacent an edge of the gate insulator than in a center portion of the gate insulator.

23. The semiconductor device of claim 16, wherein the semiconductor layer structure comprises a first source/drain region, a second source/drain region, and a junction field effect transistor (JFET) region between the first source/drain region and the second source/drain region.

24. The semiconductor device of claim 16, wherein the interface layer comprises hydrogen (H), nitrogen (N), boron (B), phosphorous (P), lanthanum (La), strontium (Sr), and/or barium (Ba).

25. The semiconductor device of claim 16, wherein a portion of the gate electrode extends below a top surface of the semiconductor layer structure.

26. A semiconductor device comprising:
a semiconductor layer structure;
a gate insulator on the semiconductor layer structure;
a gate electrode on the gate insulator; and
an interface layer between the gate insulator and the semiconductor layer structure, the interface layer having a first segment and a second segment with a gap therebetween,
wherein a thickness of the gate insulator is greater near an edge of the gate insulator than in a center portion of the gate insulator.

27. A semiconductor device comprising:
a semiconductor layer structure;
a gate insulator on the semiconductor layer structure;
a gate electrode on the gate insulator; and
an interface layer between the gate insulator and the semiconductor layer structure, the interface layer having a first segment and a second segment with a gap therebetween,
wherein the interface layer further comprises a third segment that is farther from a top surface of the semiconductor layer structure than the first segment or the second segment.

28. A semiconductor device comprising:
a semiconductor layer structure;
a gate insulator on the semiconductor layer structure;
a gate electrode on the gate insulator; and
an interface layer between the gate insulator and the semiconductor layer structure, the interface layer having a first segment and a second segment with a gap therebetween,
wherein a portion of the gate electrode extends below a top surface of the semiconductor layer structure.

29. The semiconductor device of claim 28, wherein a dopant concentration of a portion of the first segment of the interface layer decreases as the first segment extends towards a center portion of the gate insulator.

30. The semiconductor device of claim 28, wherein the interface layer comprises hydrogen (H), nitrogen (N), boron (B), phosphorous (P), lanthanum (La), strontium (Sr), and/or barium (Ba).

31. A semiconductor device comprising:
a semiconductor layer structure;
a gate insulator on the semiconductor layer structure;
a gate electrode on the gate insulator; and
an interface layer between the gate insulator and the semiconductor layer structure, the interface layer having a first segment and a second segment with a gap therebetween,
wherein the first segment of the interface layer extends from an edge of the gate insulator in a direction towards a center portion of the gate insulator,
wherein a dopant concentration of a portion of the first segment of the interface layer decreases as the first segment extends towards the center portion of the gate insulator.

32. The semiconductor device of claim 31, wherein the semiconductor layer structure comprises a first source/drain region, a second source/drain region, and a junction field effect transistor (JFET) region between the first source/drain region and the second source/drain region.

33. The semiconductor device of claim 31, wherein a portion of the gate electrode extends below a top surface of the semiconductor layer structure.

* * * * *

UNITED STATES PATENT AND TRADEMARK OFFICE
CERTIFICATE OF CORRECTION

| | |
|---|---|
| PATENT NO. | : 11,276,762 B2 |
| APPLICATION NO. | : 16/855161 |
| DATED | : March 15, 2022 |
| INVENTOR(S) | : Daniel Jenner Lichtenwalner |

It is certified that error appears in the above-identified patent and that said Letters Patent is hereby corrected as shown below:

In the Specification

Column 20, Line 45: Please correct "doped (n) silicon" to read -- doped (n⁻) silicon --

Signed and Sealed this
Twelfth Day of July, 2022

*Katherine Kelly Vidal*

Katherine Kelly Vidal
*Director of the United States Patent and Trademark Office*